(12) United States Patent
Kamo et al.

(10) Patent No.: US 11,398,604 B2
(45) Date of Patent: Jul. 26, 2022

(54) ORGANIC ELECTRONIC MATERIAL, ORGANIC LAYER, ORGANIC ELECTRONIC ELEMENT, ORGANIC ELECTROLUMINESCENT ELEMENT, DISPLAY ELEMENT, ILLUMINATION DEVICE, AND DISPLAY DEVICE

(71) Applicant: HITACHI CHEMICAL COMPANY, LTD., Tokyo (JP)

(72) Inventors: Kazuyuki Kamo, Tsukuba (JP); Naoki Asano, Tsukuba (JP); Hiroshi Takaira, Hitachinaka (JP); Iori Fukushima, Tsukuba (JP); Shigeaki Funyuu, Tsuchiura (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 467 days.

(21) Appl. No.: 16/347,991

(22) PCT Filed: Oct. 23, 2017

(86) PCT No.: PCT/JP2017/038138
§ 371 (c)(1),
(2) Date: May 7, 2019

(87) PCT Pub. No.: WO2018/084009
PCT Pub. Date: May 11, 2018

(65) Prior Publication Data
US 2019/0288217 A1    Sep. 19, 2019

(30) Foreign Application Priority Data
Nov. 7, 2016 (WO) .................. PCT/JP2016/082991

(51) Int. Cl.
*H01L 51/50* (2006.01)
*H01L 51/00* (2006.01)
(Continued)

(52) U.S. Cl.
CPC ............ *H01L 51/0072* (2013.01); *G09F 9/30* (2013.01); *H01L 27/32* (2013.01); *H01L 51/007* (2013.01);
(Continued)

(58) Field of Classification Search
None
See application file for complete search history.

(56) References Cited

U.S. PATENT DOCUMENTS

2004/0170863 A1* 9/2004 Kim ..................... C07D 209/82
428/690
2008/0149923 A1* 6/2008 Ohsawa ................. C09K 11/06
257/40

(Continued)

FOREIGN PATENT DOCUMENTS

CN    101616957 A    12/2009
CN    102791768 A    11/2012
(Continued)

OTHER PUBLICATIONS

Endo, A., Ogasawara, M., Takahashi, A., Yokoyama, D., Kato, Y. and Adachi, C. (2009), Thermally Activated Delayed Fluorescence from Sn4+-Porphyrin Complexes and Their Application to Organic Light Emitting Diodes—A Novel Mechanism for Electroluminescence. Adv. Mater., 21: 4802-4806. doi:10.1002/adma.200900983 (Cited in Specification).

(Continued)

*Primary Examiner* — Gregory D Clark
(74) *Attorney, Agent, or Firm* — Fitch Even Tabin & Flannery, LLP

(57) ABSTRACT

An organic electronic material containing a charge transport compound having a structural region represented by formula (I) and having a weight average molecular weight greater than 40,000.

—Ar—X—Y—Z    (I)

(Continued)

In the formula, Ar represents an arylene group or heteroarylene group of 2 to 30 carbon atoms, X represents a linking group, Y represents an aliphatic hydrocarbon group of 1 to 10 carbon atoms, and Z represents a substituted or unsubstituted polymerizable functional group.

22 Claims, 1 Drawing Sheet

(51) Int. Cl.
 *H01L 27/32* (2006.01)
 *H05B 33/02* (2006.01)
 *G09F 9/30* (2006.01)

(52) U.S. Cl.
 CPC ...... *H01L 51/0054* (2013.01); *H01L 51/0059* (2013.01); *H01L 51/0067* (2013.01); *H01L 51/0068* (2013.01); *H01L 51/0097* (2013.01); *H01L 51/50* (2013.01); *H01L 51/5016* (2013.01); *H01L 51/5092* (2013.01); *H05B 33/02* (2013.01); *H01L 51/5056* (2013.01); *H01L 51/5072* (2013.01)

(56) References Cited

U.S. PATENT DOCUMENTS

| | | | |
|---|---|---|---|
| 2009/0278445 A1 | 11/2009 | Jen et al. | |
| 2009/0321723 A1* | 12/2009 | Hoshi | C08G 73/026 257/40 |
| 2011/0198573 A1 | 8/2011 | Iida | |
| 2012/0074360 A1 | 3/2012 | Funyuu et al. | |
| 2013/0200337 A1 | 8/2013 | Iida et al. | |
| 2014/0084279 A1 | 3/2014 | Tanaka et al. | |
| 2015/0364718 A1* | 12/2015 | Huang | H01L 51/5253 257/40 |
| 2016/0329497 A1 | 11/2016 | Radu et al. | |

FOREIGN PATENT DOCUMENTS

| | | |
|---|---|---|
| CN | 107078227 A | 8/2017 |
| CN | 109937490 A | 6/2019 |
| EP | 3106485 A1 | 12/2016 |
| JP | 2000-036390 A | 2/2000 |
| JP | 2003-213002 A | 7/2003 |
| JP | 2005-075948 A | 3/2005 |
| JP | 2006-279007 A | 10/2006 |
| JP | 2007-302886 A | 11/2007 |
| JP | 2008-063327 A | 3/2008 |
| JP | 2008-179790 A | 8/2008 |
| JP | 2008-198989 A | 8/2008 |
| JP | 2009-536656 A | 10/2009 |
| JP | 2009-283509 A | 12/2009 |
| JP | 2010-065213 A | 3/2010 |
| JP | 2010-155985 A | 7/2010 |
| JP | 2012-158669 A | 8/2012 |
| JP | 2013-036023 A | 2/2013 |
| JP | 2013-045986 A | 3/2013 |
| JP | 2013-124271 A | 6/2013 |
| JP | 2013-214565 A | 10/2013 |
| JP | 2014-019755 A | 2/2014 |
| JP | 2014-169418 A | 9/2014 |
| JP | 2015-017231 A | 1/2015 |
| JP | 2015-035629 A | 2/2015 |
| JP | 2015-159077 | 9/2015 |
| JP | 2016-167570 A | 9/2016 |
| KR | 2014-0015385 A | 2/2014 |
| TW | 201105703 A | 2/2011 |
| TW | 201139558 A | 11/2011 |
| TW | 201615687 A | 5/2016 |
| WO | 2008/010487 A1 | 1/2008 |
| WO | 2008/108162 A1 | 9/2008 |
| WO | 2011/099531 A | 8/2011 |
| WO | 2010/140553 A | 11/2012 |
| WO | 2013/002053 A1 | 1/2013 |
| WO | 2016/076375 A1 | 5/2016 |
| WO | 2017/079042 A1 | 5/2017 |

OTHER PUBLICATIONS

Endo, A., Sato, K., Yoshimura, K., Kai, T., Kawada, A., et al. (2011) Efficient up-conversion of triplet excitons into a singlet state and its application for organic light emitting diodes. Appl. Phys. Lett. 98, 083302 ; doi: 10.1063/1.3558906 (Cited in Specification).

Nakagawa, T., Ku, S., Wong, K., Adachi, C. Electroluminescence based on thermally activated delayed fluorescence generated by a spirobifluorene donor-acceptor structure. Chem. Commun., 2012,48, 9580-9582 (Cited in Specification).

Lee, S., Yasuda, T., Nomura, H., and Adachi, C. High-efficiency organic light-emitting diodes utilizing thermally activated delayed fluorescence from triazine-based donor-acceptor hybrid molecules Appl. Phys. Lett. 101, 093306 (2012); doi: 10.1063/1.4749285 (Cited in Specification).

Zhang, Q., Li, J., Shizu, K,. Huang, S., Hirata, S., Miyazaki, H., and Adachi, C. Design of Efficient Thermally Activated Delayed Fluorescence Materials for Pure Blue Organic Light Emitting Diodes. J. Am. Chem. Soc., 134, 14706 (2012) (Cited in Specification).

Tanaka, H., Shizu, K., Miyazakiab, H., and Adachi, C. Efficient green thermally activated delayed fluorescence (TADF) from a phenoxazine-triphenyltriazine (PXZ-TRZ) derivative. Chem. Comm., 48, 11392 (2012) (Cited in Specification).

Uoyama, H., Goushi, K., Shizu, K., Nomura, H., and Adachi, C. Highly efficient organic light-emitting diodes from delayed fluorescence. Nature, 492, 234 (2012) (Cited in Specification).

Li, J., Nakagawa, T., MacDonald, J., Zhang, Q., Nomura, H., Miyazaki, H., and Adachi, C. Highly Efficient Organic Light-Emitting Diode Based on a Hidden Thermally Activated Delayed Fluorescence Channel in a Heptazine Derivative. Adv. Mater., 25, 3319 (2013) (Cited in Specification).

Ishimatsu, R., Matsunami, S., Shizu, K., Adachi, C., Nakano, K., and Imato, T. Solvent Effect on Thermally Activated Delayed Fluorescence by 1,2,3,5-Tetrakis(carbazol-9-yl)-4,6-dicyanobenzene J. Phys. Chem. A, 117, 5607 (2013) (Cited in Specification).

Serevicius, T., Nakagawa, T., Kuo, M., Cheng, S., Wong, K., Chang, C., Kwong, R. C., Xiae, S., and Adachi, C. Enhanced electroluminescence based on thermally activated delayed fluorescence from a carbazole-triazine derivative. Phys. Chem. Chem. Phys., 15, 15850 (2013) (Cited in Specification).

Nasu, K., Nakagawa, T., Nomura, H., Lin, C., Cheng, C., Tseng, M., Yasudaad, T., and Adachi, C. A highly luminescent spiro-anthracenone-based organic light-emitting diode exhibiting thermally activated delayed fluorescence Chem. Comm., 49, 10385 (2013) (Cited in Specification).

Li, B., Nomura, H., Miyazaki, H., Zhang, Q., Yoshida, K., Suzuma, Y., Orita, A., Otera, J., Adachi, C. Dicarbazolyldicyanobenzenes as Thermally Activated Delayed Fluorescence Emitters: Effect of Substitution Position on Photoluminescent and Electroluminescent Properties. Chem. Lett., 43, 319 (2014) (Cited in Specification).

Kengo Hirose et al., 53rd Meeting of the Japan Society of Applied Physics and Related Societies, 26p-ZK-4 (2006).

Md. Anwarul Karim et al., Synthesis and Characterization of Spirobifluorene-Based Polymers for Organic Light-Emitting Diode Applications, Macromolecular Research, vol. 16, No. 4, pp. 337-344, 2008, (cited in a Search Report in counterpart European Appln. dated Jul. 2, 2020).

Steffen Jungermann et al., Articles, NovelPhoto-Cross-LinkableHole-TransportingPolymers:Synthesis, Characterization, and Application in Organic Light Emitting Diodes, XP008142411, Macromolecules 2006, 39, 8911-8919 (cited in a Search Report in counterpart European Appln. dated Jul. 2, 2020).

Database WPI, Week 201420, Thomson Scientific, London, GB; AN 2014-C36254, XP002796440 (cited in a Search Report in counterpart European Appln. dated Jul. 2, 2020).

(56) References Cited

OTHER PUBLICATIONS

Database WPI, Week 201316, Thomson Scientific, London, GB; AN 2013-C49055, XP002796441 (cited in a Search Report in counterpart European Appln. dated Jul. 2, 2020).

Envin Bacher et al., "Photopatterning of Crosslinkable Hole-Conducting Materials for Application in Organic Light-Emitting Devices", Macromolecular Rapid Communications, 2004, pp. 1191-1196 XP-002636876 (cited in an search report in counterpart European Patent Application No. 17789309.6 dated Jan. 2, 2020).

Md. A. Karim et al., "Synthesis and Characterization of Spirobifluorene-Based Polymers for Organic Light-Emitting Diode Applications", Macromolecular Research, vol. 16, No. 4, pp. 337-344 (2008) (cited in an search report in counterpart European Patent Application No. 17789309.6 dated Jan. 2, 2020).

Steffen Jungermann et al., "NovelPhoto-Cross-LinkableHole-TransportingPolymers: Synthesis, Characterization, and Application in Organic Light Emitting Diodes", Macromolecules 2006, vol. 39, No. 26, pp. 8911-8919 (cited in an search report in counterpart European Patent Application No. 17789309.6 dated Jan. 2, 2020).

* cited by examiner

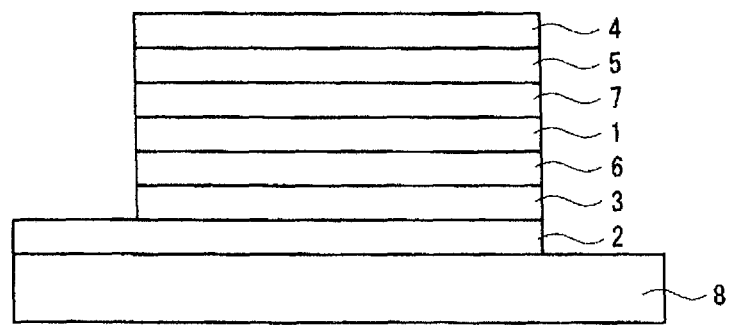

ORGANIC ELECTRONIC MATERIAL, ORGANIC LAYER, ORGANIC ELECTRONIC ELEMENT, ORGANIC ELECTROLUMINESCENT ELEMENT, DISPLAY ELEMENT, ILLUMINATION DEVICE, AND DISPLAY DEVICE

CROSS-REFERENCE TO RELATED APPLICATIONS

This application is a U.S. national phase application filed under 35 U.S.C. § 371 of International Application No. PCT/JP2017/038138, filed Oct. 23, 2017, designating the United States, which claims priority from International Application No. PCT/JP2016/082991, filed Nov. 7, 2016, which are hereby incorporated herein by reference in their entirety.

TECHNICAL FIELD

Embodiments of the present invention relate to an organic electronic material and an organic layer formed using that material. Further, other embodiments of the present invention relate to an organic electronic element and an organic electroluminescent element having the above organic layer, as well as a display element, an illumination device and a display device that use the organic electroluminescent element.

BACKGROUND ART

Organic electronic elements are elements that use an organic substance to perform an electrical operation, and because they are expected to be capable of providing advantages such as low energy consumption, low prices and superior flexibility, they are attracting considerable attention as a potential alternative technology to conventional inorganic semiconductors containing mainly silicon. Examples of organic electronic elements include organic electroluminescent elements (hereafter also referred to as "organic EL elements"), organic photoelectric conversion elements, and organic transistors and the like.

Organic EL elements are attracting attention for potential use in large-surface area solid state lighting applications to replace incandescent lamps and gas-filled lamps and the like. Further, organic EL elements are also attracting attention as the leading self-luminous display for replacing liquid crystal displays (LCD) in the field of flat panel displays (FPD), and commercial products are becoming increasingly available.

Depending on the organic materials used, organic EL elements are broadly classified into two types: low-molecular weight type organic EL elements and polymer type organic EL elements. In polymer type organic EL elements, a polymer compound is used as the organic material, whereas in low-molecular weight type organic EL elements, a low-molecular weight compound is used. On the other hand, the production methods for organic EL elements are broadly classified into dry processes in which film formation is mainly performed in a vacuum system, and wet processes in which film formation is performed by plate-based printing such as relief printing or intaglio printing, or by plateless printing such as inkjet printing. Because wet processes enable simple film formation, they are expected to be an indispensable method in the production of future large-screen organic EL displays.

Accordingly, much development of materials suitable for wet processes is being pursued, and for example, investigations are being undertaken into the formation of multilayer structures using compounds having polymerizable functional groups (for example, see Patent Document 1 and Non-Patent Document 1).

PRIOR ART DOCUMENTS

Patent Document

Patent Document 1: JP 2006-279007 A

Non-Patent Document

Non-Patent Document 1: Kengo Hirose, Daisuke Kumaki, Nobuaki Koike, Akira Kuriyama, Seiichiro Ikehata, and Shizuo Tokito, 53rd Meeting of the Japan Society of Applied Physics and Related Societies, 26p-ZK-4 (2006)

SUMMARY OF THE INVENTION

Problems to be Solved by the Invention

Generally, organic EL elements produced using polymer compounds in wet processes have the advantages of facilitating cost reductions and increases in the element surface area. However, organic EL elements having organic layers produced using conventional polymer compounds would benefit from further improvements in the element characteristics such as the drive voltage, the emission efficiency, and the emission lifespan.

In particular, conventional polymer compounds that are used as charge transport compounds have poor thermal stability, and tend to be prone to thermal degradation. If the heat resistance of a polymer compound is inadequate, then for example, the organic layer may thermally degrade as a result of high-temperature processes performed during element production, causing a deterioration in the inherent performance of the organic layer that makes it difficult to obtain the desired element characteristics. Specifically, in organic EL elements, thermal degradation of the organic layer during a high-temperature baking treatment or the like tends to raise the likelihood of an increase in drive voltage. Accordingly, the development of a charge transport compound having excellent heat resistance would be very desirable.

Embodiments of the present invention have been developed in light of the above circumstances, and have the objects of providing an organic electronic material containing a charge transport compound that is suitable for wet processes and has excellent heat resistance, and an organic layer having excellent heat resistance that is formed using the material. Further, other embodiments of the present invention have the objects of providing an organic electronic element and an organic EL element that use the above organic layer and have excellent heat resistance, as well as a display element, an illumination device and a display device that use the organic EL element.

Means to Solve the Problems

As a result of intensive investigation, the inventors of the present invention discovered that a charge transport compound having a specific structure was suitable for wet processes, exhibited excellent heat resistance, and was ideal as an organic electronic material, and they were therefore able to complete the present invention.

In other words, one embodiment of the present invention relates to an organic electronic material containing a charge transport compound having a structural region represented by formula (I) shown below and having a weight average molecular weight greater than 40,000.

  (I)

In the formula, Ar represents an arylene group or heteroarylene group of 2 to 30 carbon atoms, X represents at least one type of linking group selected from the group consisting of groups of formulas (x1) to (x10) shown below, Y represents an aliphatic hydrocarbon group of 1 to 10 carbon atoms, and Z represents a substituted or unsubstituted polymerizable functional group.

[Chemical formula 1]

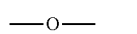  (x1)

  (x2)

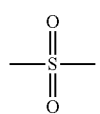  (x3)

  (x4)

  (x5)

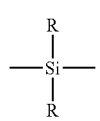  (x6)

  (x7)

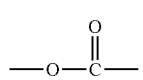  (x8)

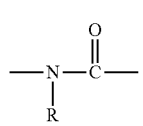  (x9)

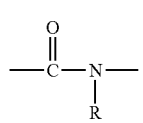  (x10)

In the above formulas, each R independently represents a hydrogen atom, a linear, cyclic or branched alkyl group of 1 to 22 carbon atoms, or an aryl group or heteroaryl group of 2 to 30 carbon atoms.

In the organic electronic material of the embodiment described above, the polymerizable functional group preferably includes at least one type of group selected from the group consisting of an oxetane group, an epoxy group, a vinyl group, an acryloyl group and a methacryloyl group. Further, the structural region represented by the above formula (I) is preferably positioned at a terminal of the charge transport compound.

In the organic electronic material of the embodiment described above, the charge transport compound preferably exhibits a thermal weight reduction upon heating to 300° C. of not more than 5%. The charge transport compound is preferably a hole injection layer material.

In the organic electronic material of the embodiment described above, the charge transport compound preferably contains a divalent structural unit having charge transport properties. Further, the charge transport compound preferably contains at least one type of structure selected from the group consisting of aromatic amine structures, carbazole structures, thiophene structures, bithiophene structures, benzene structures, phenoxazine structures and fluorene structures.

In the organic electronic material of the embodiment described above, the charge transport compound preferably has a structure that is branched in three or more directions. Further, the charge transport compound is preferably a charge transport polymer.

The organic electronic material of the embodiment described above preferably also contains a polymerization initiator. The polymerization initiator preferably contains a cationic polymerization initiator. The cationic polymerization initiator preferably contains an onium salt.

The organic electronic material of the embodiment described above preferably also contains a solvent. The solvent is preferably a non-polar solvent.

Another embodiment of the present invention relates to an organic layer formed from the organic electronic material of the embodiment described above.

Another embodiment of the present invention relates to an organic electronic element containing the organic layer described above.

Another embodiment of the present invention relates to an organic electroluminescent element containing the organic layer described above. The organic electroluminescent element preferably either has a light-emitting layer containing a phosphorescent material, or has a light-emitting layer containing a thermally activated delayed fluorescent material. The organic electroluminescent element preferably also has a flexible substrate or a resin film substrate.

Another embodiment of the present invention relates to a display element containing the organic electroluminescent element described above.

Another embodiment of the present invention relates to an illumination device containing the organic electroluminescent element described above.

Another embodiment of the present invention relates to a display device containing the illumination device described above and a liquid crystal element as a display unit.

Effects of the Invention

An embodiment of the present invention is able to provide an organic electronic material containing a charge transport compound that is suitable for wet processes and has excellent heat resistance. Further, an organic layer having excellent heat resistance can be provided using the organic electronic material. Moreover, by forming an organic layer using the above organic electronic material, other embodiments of the present invention are able to provide an organic electronic element and an organic EL element having excellent heat resistance, and a display element, an illumination device and a display device that use the organic EL element.

The present invention is related to the subject matter disclosed in International Patent Application No. PCT/JP2016/082991, the entire contents of which are incorporated by reference herein.

BRIEF DESCRIPTION OF THE DRAWINGS

FIG. 1 is a cross-sectional schematic view illustrating one example of an organic EL element of one embodiment of the present invention.

EMBODIMENTS FOR CARRYING OUT THE INVENTION

Embodiments of the present invention are described below.
<Organic Electronic Material>
An organic electronic material of one embodiment of the present invention contains at least one type of charge transport compound having a specific structural region represented by formula (I) shown below.

—Ar—X—Y—Z          (I)

In the formula, Ar represents an arylene group or heteroarylene group of 2 to 30 carbon atoms, X represents a linking group, Y represents an aliphatic hydrocarbon group of 1 to 10 carbon atoms, and Z represents a substituted or unsubstituted polymerizable functional group.

The organic electronic material may contain two or more types of charge transport compounds having the specific structural region described above, and may also contain one or more other charge transport compounds.
[Charge Transport Compound]

The charge transport compound described above, which represents a feature of the present invention, has one or more structural units having charge transport properties, and at least one of those structural units includes a structural region represented by formula (I) shown above. The structural region represented by formula (I) is described below in further detail.

In formula (I), Ar represents an arylene group or heteroarylene group of 2 to 30 carbon atoms. An arylene group means a group having a structure in which two hydrogen atoms have been removed from an aromatic hydrocarbon. A heteroarylene group means a group having a structure in which two hydrogen atoms have been removed from an aromatic heterocycle. The aromatic hydrocarbon and the aromatic heterocycle may each have a single ring structure such as benzene, or may have a condensed ring structure having multiple rings condensed together such as naphthalene.

Specific examples of the aromatic hydrocarbon include benzene, naphthalene, anthracene, tetracene, fluorene and phenanthrene. Specific examples of the aromatic heterocycle include pyridine, pyrazine, quinoline, isoquinoline, acridine, phenanthroline, furan, pyrrole, thiophene, carbazole, oxazole, oxadiazole, thiadiazole, triazole, benzoxazole, benzoxadiazole, benzothiadiazole, benzotriazole and benzothiophene.

The aromatic hydrocarbon and the aromatic heterocycle may also have a polycyclic structure in which two or more aromatic structures selected from among monocyclic and condensed ring structures are bonded together via single bonds. Examples of aromatic hydrocarbons having this type of polycyclic structure include biphenyl, terphenyl and triphenylbenzene. The aromatic hydrocarbon and the aromatic heterocycle may each be unsubstituted, or have one or more substituents. The substituent may, for example, be a linear, cyclic or branched alkyl group of 1 to 22 carbon atoms. This number of carbon atoms is more preferably from 1 to 15, even more preferably from 1 to 12, and particularly preferably from 1 to 6.

In one embodiment, Ar is preferably a phenylene group or a naphthylene group, and is more preferably a phenylene group.

In formula (I), X represents at least one type of linking group selected from the group consisting of groups of formulas (x1) to (x10) shown below.

[Chemical formula 2]

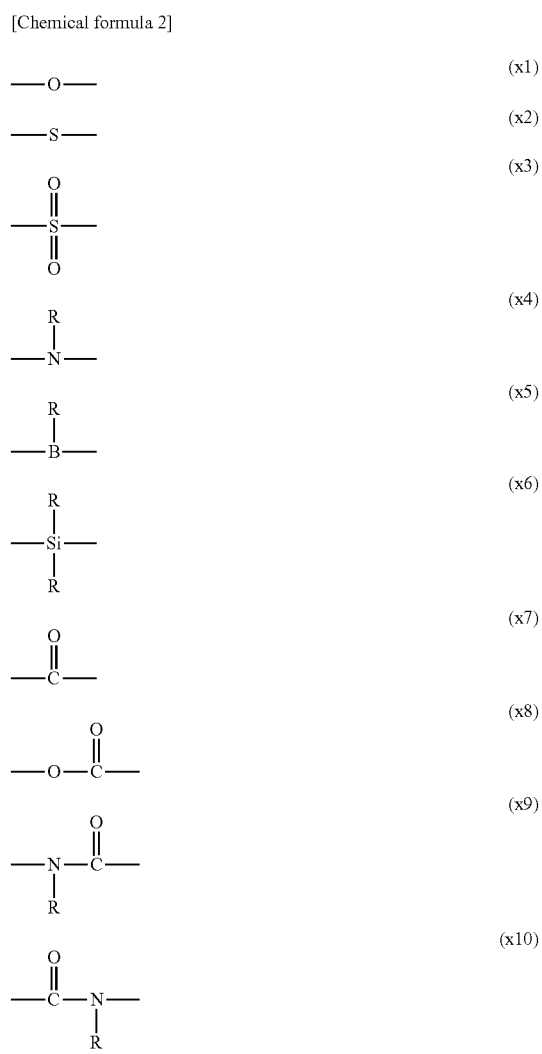

In the formulas, each R independently represents a hydrogen atom, a linear, cyclic or branched alkyl group of 1 to 22 carbon atoms, or an aryl group or heteroaryl group of 2 to 30 carbon atoms. In one embodiment, R is preferably a linear, cyclic or branched alkyl group of 1 to 22 carbon atoms. The number of carbon atoms is more preferably from 2 to 16, even more preferably from 3 to 12, and particularly preferably from 4 to 8. In another embodiment, R is preferably an aryl group of 6 to 30 carbon atoms, and is more preferably a phenyl group or a naphthyl group, and even more preferably a phenyl group.

In one embodiment, the above linking group X is preferably x1. In other words, the charge transport compound preferably has a structural region represented by formula (I-1) shown below.

—Ar—O—Y—Z  (I-1)

In formula (I), Y represents a divalent aliphatic hydrocarbon group of 1 to 10 carbon atoms. The aliphatic hydrocarbon group may be linear, branched or cyclic, or may have a combination of these structures. The aliphatic hydrocarbon group may be saturated or unsaturated.

In one embodiment, from the viewpoint of the ease of availability of the monomer that represents the raw material, Y is preferably an aliphatic hydrocarbon group having a linear structure, and is more preferably saturated. From these viewpoints, Y in formula (I) is preferably —$(CH_2)_n$—. In other words, in one embodiment, the charge transport compound preferably has a structural region represented by formula (I-2) shown below.

Ar—X—$(CH_2)_n$—Z  (I-2)

In the above formula, n is an integer from 1 to 10, preferably from 1 to 8, and more preferably from 1 to 6. From the viewpoint of the heat resistance, n is even more preferably from 1 to 4, and n is most preferably either 1 or 2.

As described above, the charge transport compound preferably has a structural region represented by at least one of the above formulas (I-1) and (I-2) shown above, and more preferably has a structural region represented by formula (I-3) shown below.

—Ar—O—$(CH_2)_n$—Z  (I-3)

In each of the above formulas, Z represents a polymerizable functional group. A "polymerizable functional group" refers to a functional group that is able to form bonds upon the application of heat and/or light. The polymerizable functional group Z may be unsubstituted, or may have a substituent. Specific examples of the polymerizable functional group Z include groups having a carbon-carbon multiple bond (such as a vinyl group, allyl group, butenyl group, ethynyl group, acryloyl group or methacryloyl group), groups having a small ring (including cyclic alkyl groups such as a cyclopropyl group and cyclobutyl group; cyclic ether groups such as an epoxy group (oxiranyl group) and oxetane group (oxetanyl group); diketene groups; episulfide groups; lactone groups; and lactam groups); and heterocyclic groups (such as a furanyl group, pyrrolyl group, thiophenyl group and silolyl group).

A vinyl group, acryloyl group, methacryloyl group, epoxy group and oxetane group are particularly preferred as the polymerizable functional group Z. From the viewpoints of improving the reactivity and the characteristics of the organic electronic element, a vinyl group, an oxetane group or an epoxy group is even more preferred. These polymerizable functional groups may have a substituent. The substituent is preferably a linear, cyclic or branched saturated alkyl group of 1 to 22 carbon atoms. This number of carbon atoms is more preferably from 1 to 8, and even more preferably from 1 to 4. The substituent is most preferably a linear saturated alkyl group of 1 to 4 carbon atoms.

In one embodiment, from the viewpoint of the storage stability, the polymerizable functional group Z is preferably an oxetane group represented by formula (z1) shown below. In the formula, R represents a hydrogen atom or a saturated alkyl group of 1 to 4 carbon atoms. R is preferably a methyl group or an ethyl group.

[Chemical formula 3]

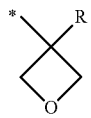

(z1)

The charge transport compound having at least one structural region represented by formula (I) contains at least one polymerizable functional group Z within the compound structure. Compounds containing a polymerizable functional group can be cured by a polymerization reaction, and this curing can change the degree of solubility in solvents. Accordingly, the charge transport compound having at least one structural region represented by formula (I) has excellent curability, and is a material that is suited to wet processes.

The charge transport compound in the present invention may be any compound that has a structural region represented by the above formula (I) and also has the ability to transport an electric charge. In one embodiment, the transported charge is preferably a positive hole. If the compound has hole transport properties, then the compound can be used, for example, as the material for a hole injection layer or a hole transport layer in an organic EL element. Further, if the compound has electron transport properties, then the compound can be used as the material for an electron transport layer or an electron injection layer. Furthermore, if the compound is able to transport both holes and electrons, then the compound can be used as the material of a light-emitting layer or the like. In one embodiment, the charge transport compound described above is preferably used as the material for a hole injection layer and/or a hole transport layer, and is more preferably used as a hole injection layer material.

Further, in one embodiment, from the viewpoint of the heat resistance, the charge transport compound preferably has a thermal weight reduction upon heating to 300° C. of not more than 5% by mass relative to the mass prior to heating. The thermal weight reduction is more preferably not more than 3.5% by mass. Moreover, in order of increasing preference, the thermal weight reduction is more preferably not more than 2.5% by mass, not more than 1.5% by mass, or not more than 1.0% by mass, and is most preferably 0.5% by mass or less.

In those cases where a specific charge transport polymer described below is used as the charge transport compound, the thermal weight reduction for the material can be more easily adjusted to a value within the above range. Here, the "thermal weight reduction upon heating to 300° C." refers to the thermal weight reduction (% by mass) when a 10 mg sample is heated in the air to 300° C. under temperature increase conditions of 5° C./minute. Measurement of this thermal weight reduction can be performed using a thermogravimetric-differential thermal analysis (TG-DTA) apparatus.

The charge transport compound has one, or two or more, structural units having charge transport properties, and at least one of those structural units has a structural region represented by formula (I) shown above. In one embodiment, the charge transport compound may have a structure that is branched in three or more directions. Charge transport compounds can be broadly classified into low-molecular weight compounds composed of a single structural unit, and polymer compounds composed of a plurality of structural units, and either of these may be used. The structural units that constitute the charge transport compound are described below.

Cases where the charge transport compound is a low-molecular weight compound are preferred in terms of enabling a high-purity material to be more easily obtained. Cases where the charge transport compound is a polymer compound are preferred in terms of enabling easier preparation of compositions, and exhibiting superior film formability. Moreover, from the viewpoints of obtaining the advantages of both, a mixture of a low-molecular weight compound and a polymer compound may also be used as the charge transport compound. Polymer compounds composed of a plurality of structural units having charge transport properties are described below in further detail as examples of the charge transport compound.

[Charge Transport Polymer]

When the charge transport compound is a polymer compound, the charge transport compound may be either a polymer or an oligomer. In the following description, these are jointly referred to using the term "charge transport polymer". The charge transport polymer has at least one of the aforementioned structural region represented by formula (I) shown below.

—Ar—X—Y—Z (I-1)

Charge transport polymers containing a structural region represented by —Ar—CH$_2$—O— at a terminal are prone to intramolecular bond cleavage under heating, and thus tend to have poor heat resistance. In contrast, by forming a charge transport polymer having a structural region represented by formula (I) in accordance with an embodiment of the present invention, the heat resistance of the charge transport polymer can be improved.

As the heat resistance improves, the degree of thermal degradation of the organic layer in high-temperature processes, for example during element production, is improved, making it easier to maintain the performance of the organic layer. In particular, in those cases where an organic layer is formed by a coating method using the charge transport polymer according to the present embodiment, any deterioration in the performance of the organic layer is suppressed, even during high-temperature baking treatments, meaning superior carrier mobility can be maintained.

The charge transport polymer may be linear, or may have a branched structure. The charge transport polymer preferably contains at least a divalent structural unit L having charge transport properties and a monovalent structural unit T that constitutes the terminal portions, and may also contain a trivalent or higher-valent structural unit B that forms a branched portion. The charge transport polymer may have only one type of each of these structural units, or may contain a plurality of types of each structural unit. In the charge transport polymer, the various structural units are bonded together at "monovalent" to "trivalent or higher-valent" bonding sites.

(Structure of Charge Transport Polymer)

Examples of partial structures contained in the charge transport polymer are described below. However, the charge transport polymer is not limited to polymers having the following partial structures. In the partial structures, "L" represents a structural unit L, "T" represents a structural unit T, and "B" represents a structural unit B. The symbol "*" represents a bonding site with another structural unit. In the following partial structures, the plurality of L units may be units having the same structure or units having mutually different structures. This also applies for the T and B units.

Linear Charge Transport Polymer

T-L-L-L-L-* [Chemical formula 4]

Charge Transport Polymers Having Branched Structures

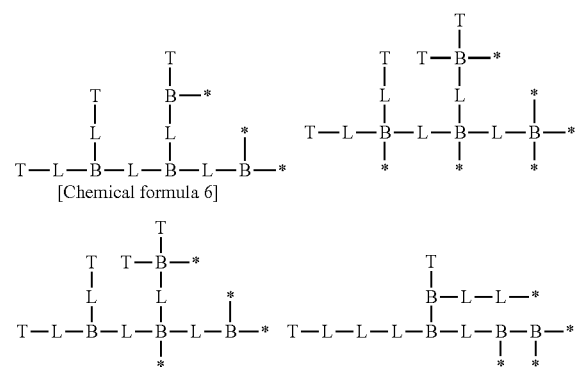

[Chemical formula 5]

[Chemical formula 6]

In one embodiment, the charge transport polymer is preferably a polymer having a divalent structural unit L with charge transport properties. Further, in one embodiment, the charge transport polymer is preferably a polymer having a structure that is branched in three or more directions, namely a polymer having a structural unit B described above. The charge transport polymer preferably contains one or more structures selected from the group consisting of aromatic amine structures, carbazole structures, thiophene structures, bithiophene structures, benzene structures, phenoxazine structures and fluorene structures. These structures are preferably included in a structural unit L described below, but may be included in a structural unit B, or may be included in both a structural unit L and a structural unit B. By including one of these structures in the charge transport polymer, the charge transport properties, and particularly the hole transport properties, can be improved.

In one embodiment, the charge transport polymer includes a structural region represented by formula (I) in at least one of the structural units L, B and T that constitute the polymer, and there are no particular limitations on the position at which the structural region is introduced. In a preferred embodiment, from the viewpoint of improving the curability, the structural region represented by formula (I) preferably exists in a structural unit T that constitutes at least one terminal portion of the charge transport polymer. A charge transport polymer in which the structural region represented by formula (I) exists in a structural unit T that constitutes a terminal portion is also preferred from the viewpoint of the ease of synthesis of the monomer compounds used for forming the charge transport polymer. The structural units of the charge transport polymer are described below in further detail.

(Structural Unit L)

The structural unit L is a divalent structural unit having charge transport properties. There are no particular limitations on the structural unit L, provided it includes an atom grouping having the ability to transport an electric charge. For example, the structural unit L may be selected from among substituted or unsubstituted structures including aromatic amine structures, carbazole structures, thiophene structures, fluorene structures, benzene structures, biphenyl structures, terphenyl structures, naphthalene structures, anthracene structures, tetracene structures, phenanthrene structures, dihydrophenanthrene structures, pyridine structures, pyrazine structures, quinoline structures, isoquinoline structures, quinoxaline structures, acridine structures, diazaphenanthrene structures, furan structures, pyrrole structures, oxazole structures, oxadiazole structures, thiazole structures, thiadiazole structures, triazole structures, benzothiophene structures, benzoxazole structures, benzoxadiazole structures, benzothiazole structures, benzothiadiazole structures, benzotriazole structures, and structures containing one, or two or more, of the above structures. The aromatic amine structures are preferably triarylamine structures, and more preferably triphenylamine structures.

In one embodiment, from the viewpoint of obtaining superior hole transport properties, the structural unit L is preferably selected from among substituted or unsubstituted structures including aromatic amine structures, carbazole structures, thiophene structures, fluorene structures, benzene structures, pyrrole structures, and structures containing one, or two or more, of these structures, and is more preferably selected from among substituted or unsubstituted structures including aromatic amine structures, carbazole structures, and structures containing one, or two or more, of these structures. In another embodiment, from the viewpoint of obtaining superior electron transport properties, the structural unit L is preferably selected from among substituted or unsubstituted structures including fluorene structures, benzene structures, phenanthrene structures, pyridine structures, quinoline structures, and structures containing one, or two or more, of these structures.

Specific examples of the structural unit L are shown below. However, the structural unit L is not limited to the following structures.

[Chemical formula 7]

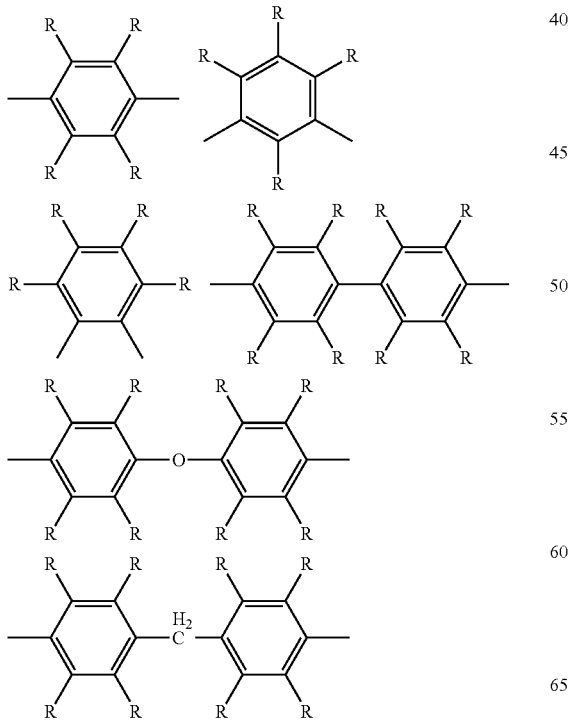
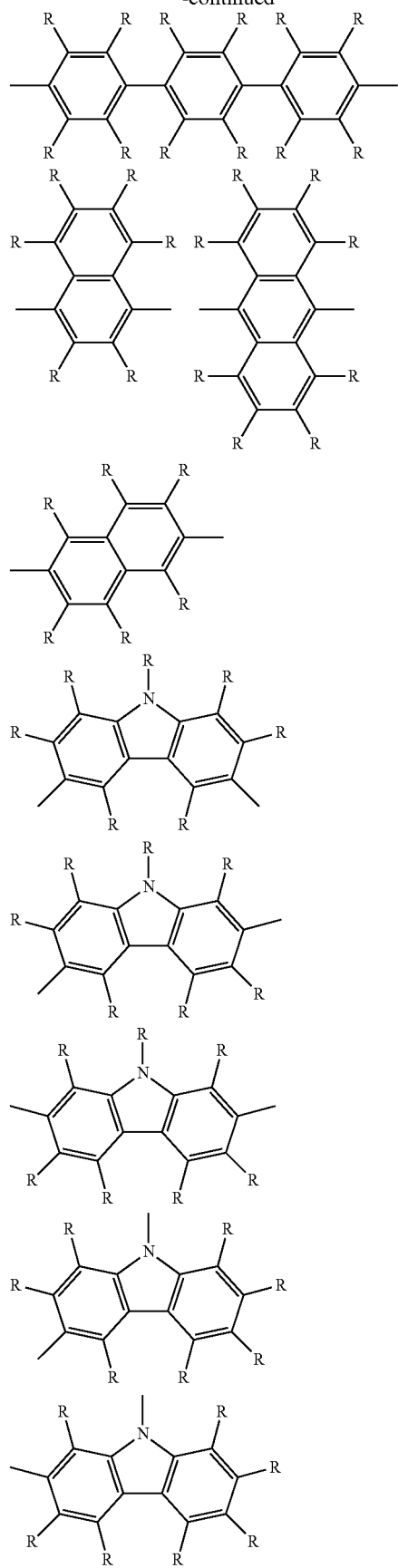

-continued
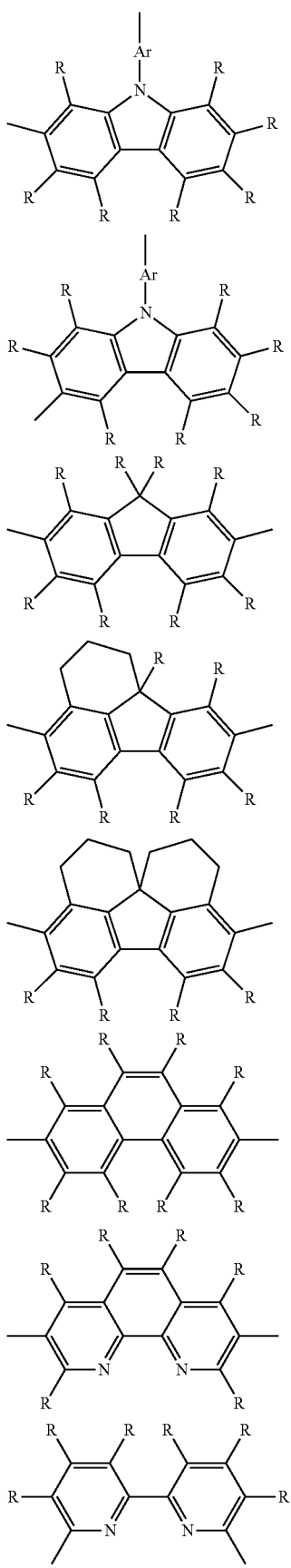
-continued
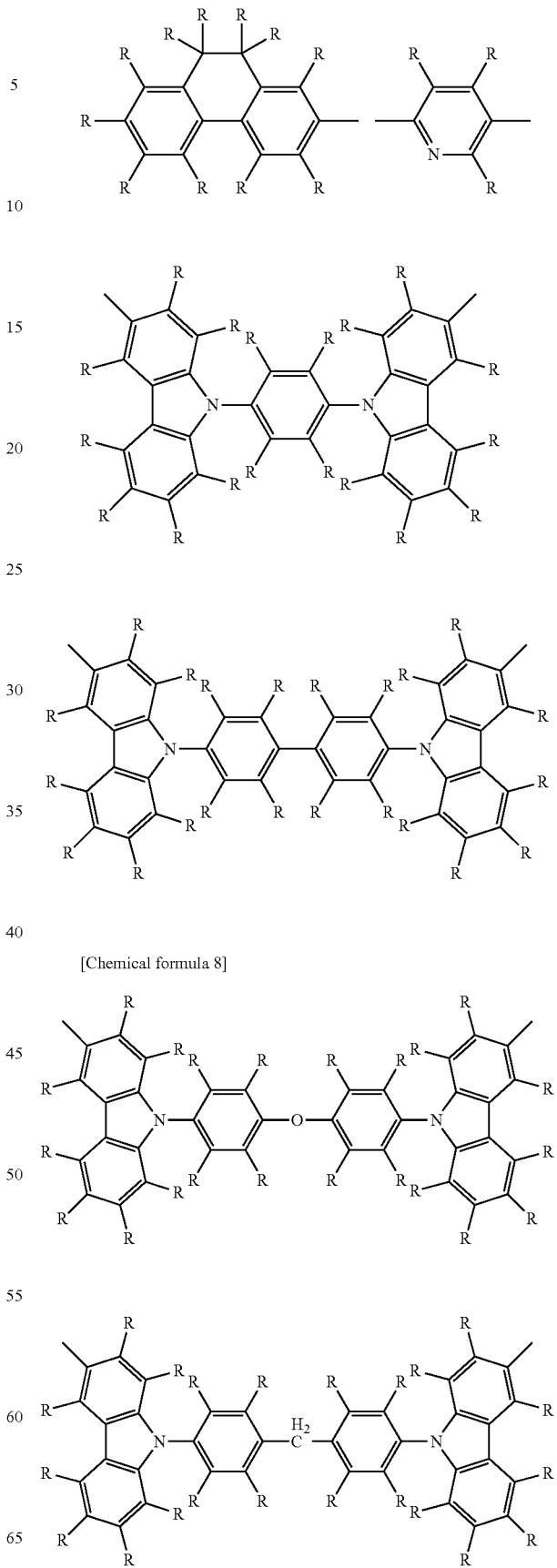
[Chemical formula 8]

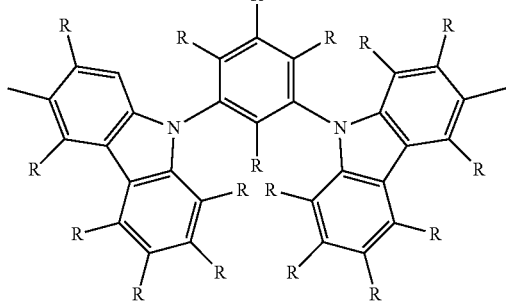
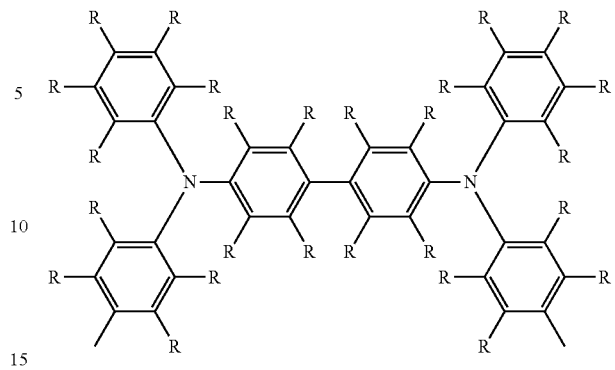
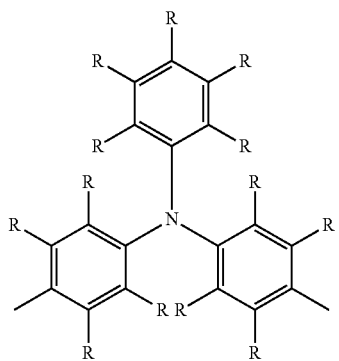
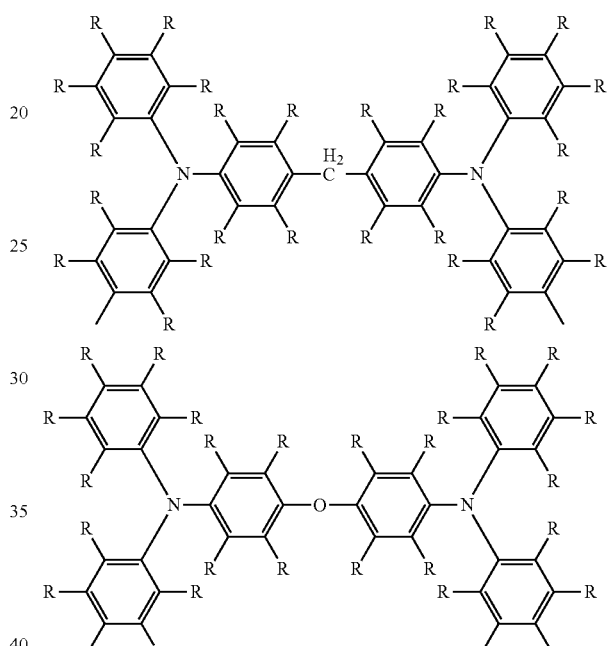
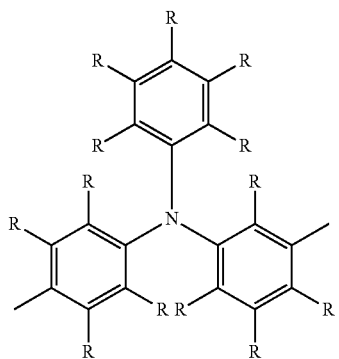
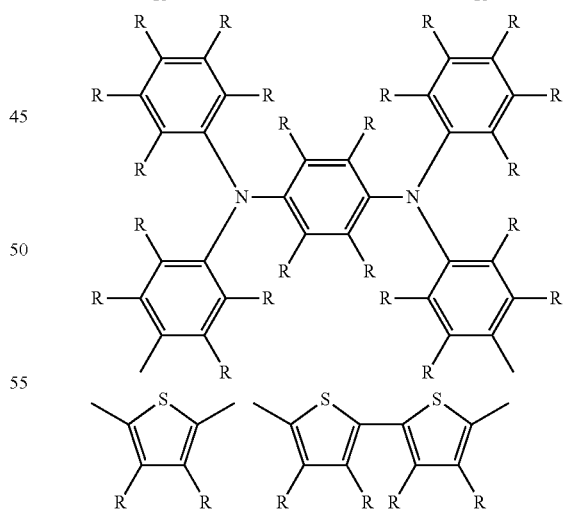
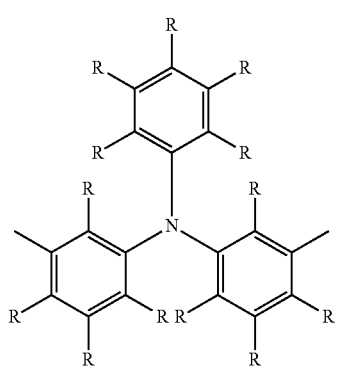
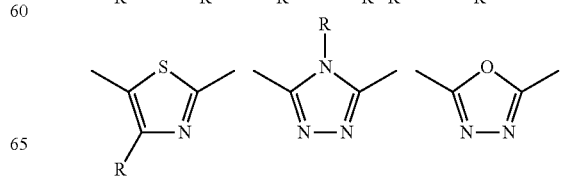

-continued

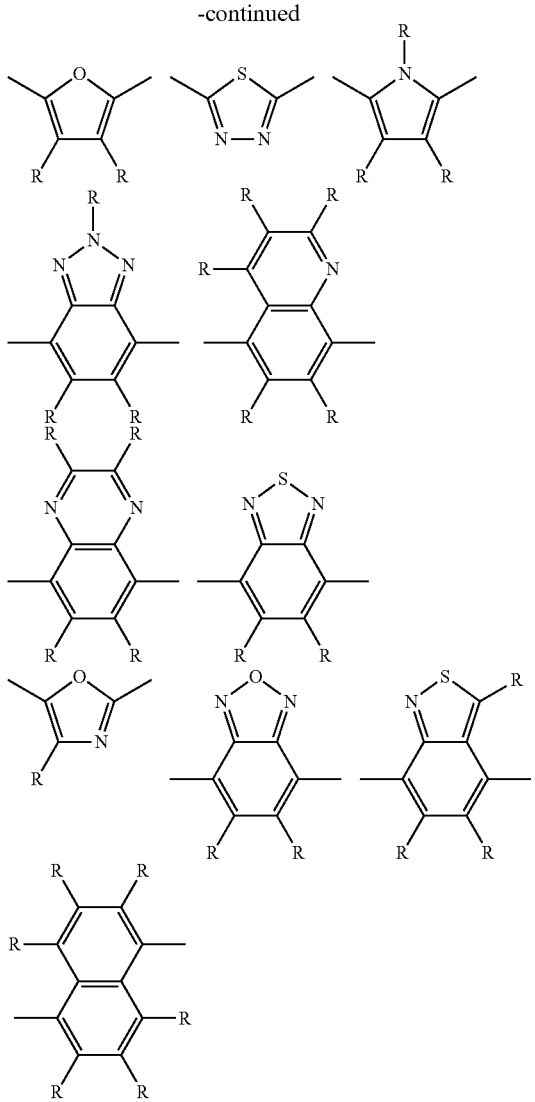

Each R independently represents a hydrogen atom or a substituent. When R is a substituent, it is preferable that each R is independently selected from a group consisting of —$R^1$ (excluding the case of a hydrogen atom), —$OR^2$, —$SR^3$, —$OCOR^4$, —$COOR^5$, —$SiR^6R^7R^8$, halogen atoms, and groups containing a polymerizable functional group.

Each of $R^1$ to $R^8$ in the above substituents independently represents a hydrogen atom, a linear, cyclic or branched alkyl group of 1 to 22 carbon atoms, or an aryl group or heteroaryl group of 2 to 30 carbon atoms. An aryl group is an atom grouping in which one hydrogen atom has been removed from an aromatic hydrocarbon. A heteroaryl group is an atom grouping in which one hydrogen atom has been removed from an aromatic heterocycle. The alkyl group may be further substituted with an aryl group or heteroaryl group of 2 to 20 carbon atoms, and the aryl group or heteroaryl group may be further substituted with a linear, cyclic or branched alkyl group of 1 to 22 carbon atoms. R is preferably a hydrogen atom, or a substituent selected from the group consisting of alkyl groups, aryl groups, and alkyl-substituted aryl groups.

In one embodiment, from the viewpoint of increasing the molecular weight of the polymer, R is more preferably a substituent. When R is a substituent, increasing the molecular weight of the charge transport polymer is easier, and superior heat resistance can be more easily obtained.

In one embodiment, the charge transport polymer may be used together with a non-polar solvent. Examples of the non-polar solvent include benzene, toluene, hexane, ethyl acetate, dioxane and tetrahydrofuran. Generally, polymers tend to be prone to a decrease in solubility in non-polar solvents as the molecular weight of the polymer increases, but when the molecular weight of the polymer is increased by introducing substituents, any deterioration in the solubility can be more easily suppressed.

Ar represents an arylene group or heteroarylene group of 2 to 30 carbon atoms. An arylene group is an atom grouping in which two hydrogen atoms have been removed from an aromatic hydrocarbon. A heteroarylene group is an atom grouping in which two hydrogen atoms have been removed from an aromatic heterocycle. Ar is preferably an arylene group, and is more preferably a phenylene group.

Examples of the aromatic hydrocarbon include monocyclic hydrocarbons, condensed ring hydrocarbons, and polycyclic hydrocarbons in which two or more hydrocarbons selected from among monocyclic hydrocarbons and condensed ring hydrocarbons are bonded together via single bonds. Examples of the aromatic heterocycles include monocyclic heterocycles, condensed ring heterocycles, and polycyclic heterocycles in which two or more heterocycles selected from among monocyclic heterocycles and condensed ring heterocycles are bonded together via single bonds.

(Structural Unit B)

The structural unit B is a trivalent or higher-valent structural unit that constitutes a branched portion in those cases where the charge transport polymer has a branched structure. From the viewpoint of improving the durability of the organic electronic element, the structural unit B is preferably not higher than hexavalent, and is more preferably either trivalent or tetravalent. The structural unit B is preferably a unit that has charge transport properties. For example, from the viewpoint of improving the durability of the organic electronic element, the structural unit B is typically selected from among substituted or unsubstituted structures including aromatic amine structures, carbazole structures, condensed polycyclic aromatic hydrocarbon structures, and structures containing one, or two or more, of these structures.

Specific examples of the structural unit B are shown below. However, the structural unit B is not limited to the following structures.

[Chemical formula 9]

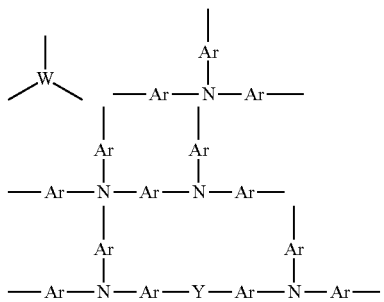

-continued

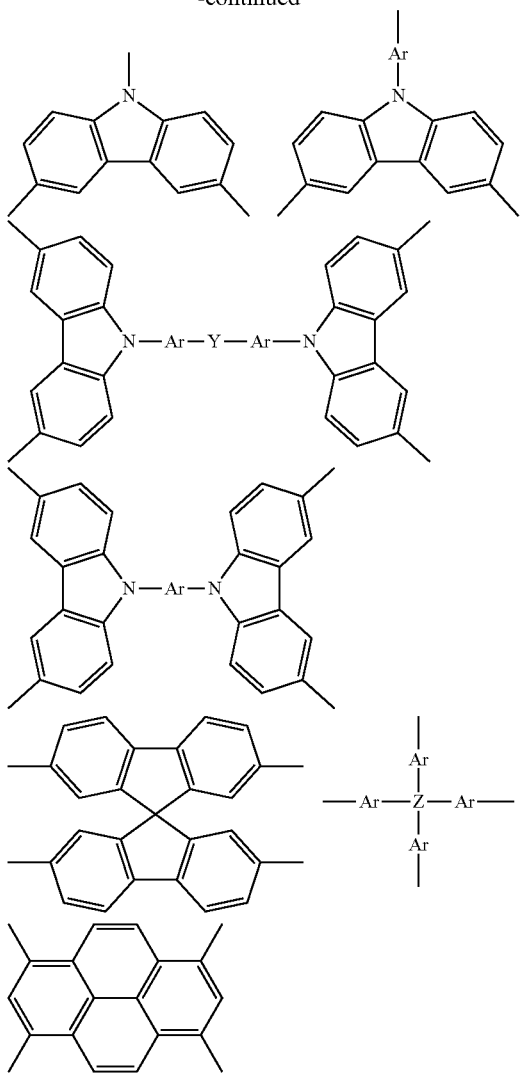

W represents a trivalent linking group, and for example, represents an arenetriyl group or heteroarenetriyl group of 2 to 30 carbon atoms. An arenetriyl group is an atom grouping in which three hydrogen atoms have been removed from an aromatic hydrocarbon. A heteroarenetriyl is an atom grouping in which three hydrogen atoms have been removed from an aromatic heterocycle. Each Ar independently represents a divalent linking group, and for example, may represent an arylene group or heteroarylene group of 2 to 30 carbon atoms. Ar preferably represents an arylene group, and more preferably a phenylene group. Y represents a divalent linking group, and examples include divalent groups in which an additional hydrogen atom has been removed from any of the R groups having one or more hydrogen atoms (but excluding groups containing a polymerizable functional group) described in relation to the structural unit L. Z represents a carbon atom, a silicon atom or a phosphorus atom. In the structural units, the benzene rings and Ar groups may have a substituent. Examples of the substituent include the substituents described for the R groups in the structural unit L.

(Structural Unit T)

The structural unit T is a monovalent structural unit that constitutes a terminal portion of the charge transport polymer. From the viewpoint of enhancing the curability, the charge transport polymer preferably has a polymerizable functional group at a terminal portion. In one embodiment, the charge transport polymer preferably contains a structural unit T1 having a structure represented by formula (I) shown below. In the formula, Ar, X, Y and Z are as described above.

$$—Ar—X—Y—Z \quad (I)$$

By using a charge transport polymer containing the above structural unit T1, excellent curability and heat resistance can be more easily obtained. The structural unit T1 preferably has at least one of the structures represented by formulas (I-1) and (I-2) described above. The structural unit T1 more preferably has a structure represented by formula (I-3) described above.

The charge transport polymer may also contain another monovalent structural unit constituting a terminal portion that differs from the structural unit T1 described above, provided the charge transport properties and curability are not impaired.

In one embodiment, in addition to the structural unit T1 described above, the charge transport polymer may contain a monovalent structural unit T2 having a structure represented by formula (II) shown below. In those cases where the charge transport polymer has both the structural unit T1 and the structural unit T2, the heat resistance can be more easily improved.

$$—Ar-J-R1 \quad (II)$$

In the formula, Ar represents an arylene group or heteroarylene group of 2 to 30 carbon atoms.

Moreover, J represents a single bond, or a divalent linking group selected from the group consisting of an ester linkage (—COO—) and the groups represented by formulas (x1) to (x10) that were listed above as examples of the linking group X in the formula (I).

In the above linking group, R represents a linear, cyclic or branched alkyl group of 1 to 22 carbon atoms or an aryl group of 6 to 30 carbon atoms.

In one embodiment, Ar in formula (II) is preferably an arylene group of 6 to 30 carbon atoms. A phenylene group or naphthylene group is more preferred, and a phenylene group is particularly desirable.

In one embodiment, J in formula (II) is preferably an ester linkage or a linking group (—NR—) having a structure in which an additional one hydrogen atom has been removed from an amino group. In this linking group (—NR—), R is preferably a phenyl group.

In one embodiment, R1 in formula (II) represents a linear, cyclic or branched alkyl group of 1 to 22 carbon atoms, wherein this number of carbon atoms is more preferably from 2 to 16, even more preferably from 3 to 12, and particularly preferably from 4 to 8.

In order to improve the heat resistance of the charge transport polymer, the proportion of cyclic structures contained in the molecule is preferably increased. From this viewpoint, in one embodiment, R1 in the above formula (II) is preferably a cyclic alkyl group (cycloalkyl group) of 3 to 30 carbon atoms. The number of carbon atoms is more preferably from 5 to 20, and even more preferably from 6 to 15. The cycloalkyl group may be saturated or unsaturated, but is preferably saturated. Further, the cyclic group may have a structure that is either monocyclic or polycyclic, but preferably has a polycyclic structure. Specific examples of R1 include an adamantyl group and the like.

In another embodiment, R1 in formula (II) is preferably an aryl group of 6 to 30 carbon atoms, is more preferably a phenyl group or a naphthyl group, and is even more preferably a phenyl group.

Although not a particular limitation, in one embodiment, the structural unit T2 preferably has a structure in which J represents an ester linkage and R1 represents a cycloalkyl group in the above formula (II).

In one embodiment, from the viewpoint of improving both the curability and the heat resistance of the charge transport polymer, the proportion of the structural unit T1 having a structure represented by formula (I), relative to the total of all the structural units T, is preferably at least 50 mol %, more preferably at least 75 mol %, and even more preferably 85 mol % or greater. This proportion of the structural unit T1 may also be set to 100 mol %.

In one embodiment, from the viewpoint of further improving the heat resistance of the charge transport polymer, a structural unit T2 is preferably used in addition to the structural unit T1. In this case, the proportion of the structural unit T2, relative to the total of all the structural units T (T1+T2), is preferably not more than 75 mol %, more preferably not more than 50 mol %, and even more preferably 25 mol % or less. On the other hand, the proportion of the structural unit T1 is preferably at least 25 mol %, more preferably at least 50 mol %, and even more preferably 75 mol % or greater. By adjusting the proportions of the structural units T1 and T2 so as to fall within the above ranges, the heat resistance can be further improved without impairing the curability.

From the viewpoint of contributing to a change in the degree of solubility, the polymerizable functional group is preferably included in the charge transport polymer in a large amount. On the other hand, from the viewpoint of not impeding the charge transport properties, the amount included in the charge transport polymer is preferably kept small. The amount of the polymerizable functional group may be set as appropriate with due consideration of these factors.

For example, from the viewpoint of obtaining a satisfactory change in the degree of solubility, the number of polymerizable functional groups per one molecule of the charge transport polymer is preferably at least 2, and more preferably 3 or greater. Further, from the viewpoint of maintaining good charge transport properties, the number of polymerizable functional groups is preferably not more than 1,000, and more preferably 500 or fewer. Here, the number of polymerizable functional groups means the total of the polymerizable functional group Z contained in the structural region represented by formula (I) and any other polymerizable functional groups.

The number of polymerizable functional groups per one molecule of the charge transport polymer can be determined as an average value using the ratio of the amount added of the monomer having the polymerizable functional group relative to the total of all the amounts added of the monomers corresponding with the various structural units used in the synthesis of the charge transport polymer, and the weight average molecular weight or the like of the charge transport polymer.

Further, the number of polymerizable functional groups can also be calculated as an average value using the ratio between the integral of the signal attributable to the polymerizable functional group and the integral of the total spectrum in the $^1$H-NMR (nuclear magnetic resonance) spectrum of the charge transport polymer, and the weight average molecular weight or the like of the charge transport polymer.

In terms of ease of calculation, if the amounts added of the various components are clear, then the number of polymerizable functional groups is preferably determined from these amounts.

(Number Average Molecular Weight)

The number average molecular weight of the charge transport polymer can be adjusted appropriately with due consideration of the solubility in solvents and the film formability and the like. From the viewpoint of ensuring superior charge transport properties, the number average molecular weight is preferably at least 500, more preferably at least 1,000, and even more preferably 2,000 or greater. Further, from the viewpoints of maintaining favorable solubility in solvents and facilitating the preparation of ink compositions, the number average molecular weight is preferably not more than 1,000,000, more preferably not more than 100,000, and even more preferably 50,000 or less.

(Weight Average Molecular Weight)

The weight average molecular weight of the charge transport polymer can be adjusted appropriately with due consideration of the solubility in solvents and the film formability and the like. From the viewpoint of ensuring superior charge transport properties, the weight average molecular weight is preferably at least 1,000, more preferably at least 5,000, and even more preferably 10,000 or greater. From the viewpoint of more easily obtaining superior heat resistance, the weight average molecular weight is preferably at least 40,000, and more preferably 41,000 or greater. Further, from the viewpoints of maintaining favorable solubility in solvents and facilitating the preparation of ink compositions, the weight average molecular weight is preferably not more than 1,000,000, more preferably not more than 700,000, and even more preferably 400,000 or less.

The number average molecular weight and the weight average molecular weight can be measured by gel permeation chromatography (GPC) under the conditions described below, using a calibration curve of standard polystyrenes.

Feed pump: L-6050, manufactured by Hitachi High-Technologies Corporation

UV-Vis detector: L-3000, manufactured by Hitachi High-Technologies Corporation

Columns. Gelpack (a registered trademark) GL-A160S/GL-A150S, manufactured by Hitachi Chemical Co., Ltd.

Eluent: THF (for HPLC, stabilizer-free), manufactured by Wako Pure Chemical Industries, Ltd.

Flow rate: 1 mL/min

Column temperature: room temperature

Molecular weight standards: standard polystyrenes (Proportions of Structural Units)

From the viewpoint of obtaining satisfactory charge transport properties, the proportion of the structural unit L contained in the charge transport polymer, relative to the total of all the structural units, is preferably at least 10 mol %, more preferably at least 20 mol %, and even more preferably 30 mol % or higher. If the structural unit T and the optionally included structural unit B are taken into consideration, then the proportion of the structural unit L is preferably not more than 95 mol %, more preferably not more than 90 mol %, and even more preferably 85 mol % or less.

From the viewpoint of improving the characteristics of the organic electronic element, or from the viewpoint of suppressing any increase in the viscosity and enabling more favorable synthesis of the charge transport polymer, the proportion of the structural unit T contained in the charge transport polymer, relative to the total of all the structural units, is preferably at least 5 mol %, more preferably at least 10 mol %, and even more preferably 15 mol % or higher. Further, from the viewpoint of obtaining satisfactory charge transport properties, the proportion of the structural unit T is preferably not more than 60 mol %, more preferably not more than 55 mol %, and even more preferably 50 mol % or less. In one embodiment, the proportion of the structural unit T means the proportion of the structural unit T1 having a structural region represented by formula (I). In another embodiment, the proportion of the structural unit T means the total amount of the structural unit T1 and other structural unit(s) T2.

In those cases where the charge transport polymer includes a structural unit B, from the viewpoint of improving the durability of the organic electronic element, the proportion of the structural unit B, relative to the total of all the structural units, is preferably at least 1 mol %, more preferably at least 5 mol %, and even more preferably 10 mol % or higher. Further, from the viewpoints of suppressing any increase in the viscosity and enabling more favorable synthesis of the charge transport polymer, or from the viewpoint of ensuring satisfactory charge transport properties, the proportion of the structural unit B is preferably not more than 50 mol %, more preferably not more than 40 mol %, and even more preferably 30 mol % or less.

From the viewpoint of ensuring efficient curing of the charge transport polymer, the proportion of the polymerizable functional group in the charge transport polymer, relative to the total of all the structural units, is preferably at least 0.1 mol %, more preferably at least 1 mol %, and even more preferably 3 mol % or higher. Further, from the viewpoint of obtaining favorable charge transport properties, the proportion of the polymerizable functional group is preferably not more than 70 mol %, more preferably not more than 60 mol %, and even more preferably 50 mol % or less. Here, the "proportion of the polymerizable functional group" refers to the proportion of structural units having the polymerizable functional group relative to the total of all the structural units. In those cases where the charge transport polymer also contains a polymerizable functional group Z' other than the polymerizable functional group Z contained in the structural region of formula (I), the proportion of the polymerizable functional group means the proportion of the combination of those structural units having either of the polymerizable functional groups Z and Z' relative to the total of all the structural units.

Considering the balance between the charge transport properties, the durability, and the productivity and the like, the ratio (molar ratio) between the structural unit L and the structural unit T is preferably L:T=100:(1 to 70), more preferably 100:(3 to 50), and even more preferably 100:(5 to 30). Further, in those cases where the charge transport polymer also includes the structural unit B, the ratio (molar ratio) between the structural unit L, the structural unit T and the structural unit B is preferably L:T:B=100:(10 to 200):(10 to 100), more preferably 100:(20 to 180):(20 to 90), and even more preferably 100:(40 to 160):(30 to 80).

The proportion of each structural unit can be determined from the amount added of the monomer corresponding with that structural unit during synthesis of the charge transport polymer. Further, the proportion of each structural unit can also be calculated as an average value using the integral of the spectrum attributable to the structural unit in the $^1$H-NMR spectrum of the charge transport polymer. In terms of ease of calculation, if the amount added of the monomer is clear, then the proportion of the structural unit preferably employs the value determined using the amount added of the monomer.

When the charge transport polymer is a hole transport material, from the viewpoint of obtaining superior hole injection properties and hole transport properties, the polymer is preferably a compound containing a structural unit having an aromatic amine structure and/or a structural unit having a carbazole structure as the main structural unit(s). From this viewpoint, the ratio of the total number of units having an aromatic amine structure and/or units having a carbazole structure, relative to the total number of all the structural units within the polymer compound (but excluding the terminal structural units), is preferably at least 40%, more preferably at least 45%, and even more preferably 50% or greater. The proportion of units having an aromatic amine structure and/or units having a carbazole structure may be 100%.

(Production Method)

The charge transport polymer can be produced by various synthesis methods, and there are no particular limitations. For example, conventional coupling reactions such as the Suzuki coupling, Negishi coupling, Sonogashira coupling, Stille coupling and Buchwald-Hartwig coupling reactions can be used. The Suzuki coupling is a reaction in which a cross-coupling reaction is initiated between an aromatic boronic acid derivative and an aromatic halide using a Pd catalyst. By using a Suzuki coupling, the charge transport polymer can be produced easily by bonding together the desired aromatic rings.

In the coupling reaction, a Pd(0) compound, Pd(II) compound, or Ni compound or the like is used as a catalyst. Further, a catalyst species generated by mixing a precursor such as tris(dibenzylideneacetone)dipalladium(0) or palladium(II) acetate with a phosphine ligand can also be used. Reference may also be made to WO 2010/140553 in relation to synthesis methods for the charge transport polymer.

[Dopant]

The organic electronic material may also contain a dopant. There are no particular limitations on the dopant, provided it is a compound that yields a doping effect upon addition to the organic electronic material, enabling an improvement in the charge transport properties. Doping includes both p-type doping and n-type doping. In p-type doping, a substance that functions as an electron acceptor is used as the dopant, whereas in n-type doping, a substance that functions as an electron donor is used as the dopant. To improve the hole transport properties, p-type doping is preferably used, whereas to improve the electron transport properties, n-type doping is preferably used. The dopant used in the organic electronic material may be a dopant that exhibits either a p-type doping effect or an n-type doping effect. Further, a single type of dopant may be added alone, or a mixture of a plurality of dopant types may be added.

The dopants used in p-type doping are electron-accepting compounds, and examples include Lewis acids, protonic acids, transition metal compounds, ionic compounds, halogen compounds and π-conjugated compounds. Specific examples include Lewis acids such as $FeCl_3$, $PF_5$, $AsF_5$, $SbF_5$, $BF_5$, $BCl_3$ and $BBr_3$; protonic acids, including inorganic acids such as HF, HCl, HBr, $HNO_3$, $H_2SO_4$ and $HClO_4$, and organic acids such as benzenesulfonic acid, p-toluenesulfonic acid, dodecylbenzenesulfonic acid, polyvinylsulfonic acid, methanesulfonic acid, trifluoromethanesulfonic acid, trifluoroacetic acid, 1-butanesulfonic acid, vinylphenylsulfonic acid and camphorsulfonic acid; transition metal compounds such as FeOCl, $TiCl_4$, $ZrCl_4$, $HfCl_4$, $NbF_5$, $AlCl_3$, $NbCl_5$, $TaCl_5$ and $MoF_5$; ionic compounds, including salts containing a perfluoro anion such as a tetrakis(pentafluorophenyl)borate ion, tris(trifluoromethanesulfonyl)methide ion, bis(trifluoromethanesulfonyl)imide ion, hexafluoroantimonate ion, $AsF_6^-$ (hexafluoroarsenate ion), $BF_4^-$ (tetrafluoroborate ion) or $PF_6^-$ (hexafluorophosphate ion), and salts having a conjugate base of an aforementioned protonic acid as an anion; halogen compounds such as $Cl_2$, $Br_2$, $I_2$, ICl, $ICl_3$, IBr and IF; and π-conjugated compounds such as TCNE (tetracyanoethylene) and TCNQ (tetracyanoquinodimethane). Further, the electron-accepting compounds disclosed in JP 2000-36390 A, JP 2005-75948 A, and JP 2003-213002 A and the like can also be used.

Lewis acids, ionic compounds, and π-conjugated compounds and the like are preferred, and ionic compounds are more preferred. Among ionic compounds, onium salts are particularly desirable. An onium salt is a compound composed of a cation moiety containing an onium ion such as an iodonium or ammonium ion, and a counter anion moiety.

The dopants used in n-type doping are electron-donating compounds, and examples include alkali metals such as Li and Cs; alkaline earth metals such as Mg and Ca; salts of alkali metals and/or alkaline earth metals such as LiF and $Cs_2CO_3$; metal complexes; and electron-donating organic compounds.

In order to make it easier to change the degree of solubility of the organic layer, the use of a compound that can function as a polymerization initiator for the polymerizable functional group as the dopant is preferred. Examples of compounds that combine a function as a dopant with a function as a polymerization initiator include the ionic compounds described above.

[Other Optional Components]

The organic electronic material may also contain charge transport low-molecular weight compounds and other charge transport polymers or the like.

[Contents]

From the viewpoint of obtaining favorable charge transport properties, the amount of the charge transport compound, relative to the total mass of the organic electronic material, is preferably at least 50% by mass, more preferably at least 70% by mass, and even more preferably 80% by mass or greater. The amount may be 100% by mass.

When a dopant is included, from the viewpoint of improving the charge transport properties of the organic electronic material, the amount of the dopant relative to the total mass of the organic electronic material is preferably at least 0.01% by mass, more preferably at least 0.1% by mass, and even more preferably 0.5% by mass or greater. Further, from the viewpoint of maintaining favorable film formability, the amount of the dopant relative to the total mass of the organic electronic material is preferably not more than 50% by mass, more preferably not more than 30% by mass, and even more preferably 20% by mass or less.

[Polymerization Initiator]

The organic electronic material of an embodiment of the present invention preferably contains a polymerization initiator. Conventional radical polymerization initiators, cationic polymerization initiators, and anionic polymerization initiators and the like can be used as the polymerization initiator. From the viewpoint of enabling simple preparation of ink compositions, the use of a substance that exhibits both a function as a dopant and a function as a polymerization initiator is preferred. For example, the onium salts described above can be used favorably as cationic polymerization initiators that also exhibit the function of a dopant. Examples include salts of a perfluoro anion and a cation such as an iodonium ion or ammonium ion. Specific examples of these onium salts include the compounds shown below.

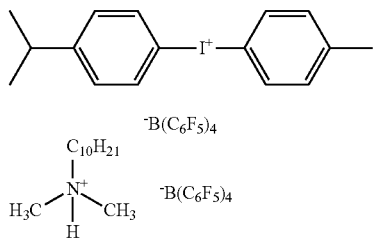

[Chemical formula 10]

<Ink Composition>

The organic electronic material may be formed as an ink composition containing the organic electronic material of the embodiment described above and a solvent that is capable of dissolving or dispersing the material. By using this type of ink composition, an organic layer can be formed easily using a simple coating method.

[Solvent]

Water, organic solvents, or mixed solvents thereof can be used as the solvent. Examples of the organic solvent include alcohols such as methanol, ethanol and isopropyl alcohol; alkanes such as pentane, hexane and octane; cyclic alkanes such as cyclohexane; aromatic hydrocarbons such as benzene, toluene, xylene, mesitylene, tetralin and diphenylmethane; aliphatic ethers such as ethylene glycol dimethyl ether, ethylene glycol diethyl ether and propylene glycol-1-monomethyl ether acetate; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole and 2,4-dimethylanisole; aliphatic esters such as ethyl acetate, n-butyl acetate, ethyl lactate and n-butyl lactate; aromatic esters such as phenyl acetate, phenyl propionate, methyl benzoate, ethyl benzoate, propyl benzoate and n-butyl benzoate; amide-based solvents such as N,N-dimethylformamide and N,N-dimethylacetamide; as well as dimethyl sulfoxide, tetrahydrofuran, acetone, chloroform and methylene chloride and the like. Preferred solvents include aromatic hydrocarbons, aliphatic esters, aromatic esters, aliphatic ethers, and aromatic ethers and the like.

[Additives]

The ink composition may also contain additives as optional components. Examples of these additives include polymerization inhibitors, stabilizers, thickeners, gelling agents, flame retardants, antioxidants, reduction inhibitors, oxidizing agents, reducing agents, surface modifiers, emulsifiers, antifoaming agents, dispersants and surfactants.

[Contents]

The amount of the solvent in the ink composition can be determined with due consideration of the use of the composition in various application methods. For example, the amount of the solvent is preferably an amount that yields a ratio of the charge transport polymer relative to the solvent that is at least 0.1% by mass, more preferably at least 0.2% by mass, and even more preferably 0.5% by mass or greater. Further, the amount of the solvent is preferably an amount that yields a ratio of the charge transport polymer relative to the solvent that is not more than 20% by mass, more preferably not more than 15% by mass, and even more preferably 10% by mass or less.

<Organic Layer>

An organic layer that represents one embodiment of the present invention is a layer formed using the organic electronic material of the embodiment described above. The organic electronic material of the above embodiment may be used in the form of an ink composition. By using an ink composition, the organic layer can be formed favorably by a coating method. Examples of the coating method include conventional methods such as spin coating methods, casting methods, dipping methods, plate-based printing methods such as relief printing, intaglio printing, offset printing, lithographic printing, relief reversal offset printing, screen printing and gravure printing, and plateless printing methods such as inkjet methods. When the organic layer is formed by a coating method, the organic layer (coating layer) obtained following coating may be dried using a hot plate or an oven to remove the solvent.

The charge transport compound may also be subjected to a polymerization reaction by performing light irradiation or a heat treatment or the like, thereby changing the degree of solubility of the organic layer. By stacking organic layers having changed degrees of solubility, multilayering of an organic electronic element can be performed with ease. Reference may also be made to WO 2010/140553 in relation to the method used for forming the organic layer. According to the present invention, the heat treatment described above can be performed at a temperature exceeding 200° C. (also referred to as a high-temperature baking treatment), and yet thermal degradation of the organic layer following the heat treatment can be suppressed.

From the viewpoint of improving the efficiency of charge transport, the thickness of the organic layer obtained following drying or curing is preferably at least 0.1 nm, more preferably at least 1 nm, and even more preferably 3 nm or greater. Further, from the viewpoint of reducing the electrical resistance, the thickness of the organic layer is preferably not more than 300 nm, more preferably not more than 200 nm, and even more preferably 100 nm or less.

<Organic Electronic Element>

An organic electronic element that represents one embodiment of the present invention has at least an organic layer of the embodiment described above. Examples of the organic electronic element include an organic EL element, an organic photoelectric conversion element, and an organic transistor. The organic electronic element preferably has at least a structure in which an organic layer is disposed between a pair of electrodes.

[Organic EL Element]

An organic EL element of one embodiment of the present invention has at least an organic layer of the embodiment described above. The organic EL element typically includes a light-emitting layer, an anode, a cathode and a substrate, and if necessary, may also have other functional layers such as a hole injection layer, electron injection layer, hole transport layer and electron transport layer. Each layer may be formed by a vapor deposition method, or by a coating method. The organic EL element preferably has the organic layer as the light-emitting layer or as another functional layer, more preferably has the organic layer as a functional layer, and even more preferably has the organic layer as at least one of a hole injection layer and a hole transport layer.

FIG. 1 is a cross-sectional schematic view illustrating one example of an organic EL element according to an embodiment of the present invention. The organic EL element in FIG. 1 is an element with a multilayer structure, and has a substrate 8, an anode 2, a hole injection layer 3 and a hole transport layer 6 each formed from an organic layer of the embodiment described above, a light-emitting layer 1, an electron transport layer 7, an electron injection layer 5 and a cathode 4 provided in that order. Each of these layers is described below.

In FIG. 1, for example, the hole injection layer 3 and the hole transport layer 6 are organic layers formed using the organic electronic material described above. However, the organic EL element according to an embodiment of the present invention is not limited to this type of structure, and another organic layer may be formed using the organic electronic material of the present invention.

[Light-Emitting Layer]

Examples of the materials that can be used for the light-emitting layer include low-molecular weight compounds, polymers, and dendrimers and the like. Polymers exhibit good solubility in solvents, meaning they are suitable for coating methods, and are consequently preferred. Examples of the light-emitting material include fluorescent materials, phosphorescent materials, and thermally activated delayed fluorescent materials (TADF).

Specific examples of the fluorescent materials include low-molecular weight compounds such as perylene, coumarin, rubrene, quinacridone, stilbene, color laser dyes, aluminum complexes, and derivatives of these compounds; polymers such as polyfluorene, polyphenylene, polyphenylenevinylene, polyvinylcarbazole, fluorene-benzothiadiazole copolymers, fluorene-triphenylamine copolymers, and derivatives of these compounds; and mixtures of the above materials.

Examples of materials that can be used as the phosphorescent materials include metal complexes and the like containing a metal such as Ir or Pt or the like. Specific examples of Ir complexes include FIr(pic) (iridium(III) bis[(4,6-difluorophenyl)-pyridinato-N,$C^2$]picolinate) which emits blue light, Ir(ppy)$_3$ (fac-tris(2-phenylpyridine)iridium) which emits green light, and (btp)$_2$Ir(acac) (bis[2-(2'-benzo[4,5-α]thienyl)pyridinato-N,$C^3$]iridium(acetyl-acetonate)) and Ir(piq)$_3$ (tris(1-phenylisoquinoline)iridium) which emit red light. Specific examples of Pt complexes include PtOEP (2,3,7,8,12,13,17,18-octaethyl-21H,23H-porphyrin-platinum) which emits red light.

When the light-emitting layer contains a phosphorescent material, a host material is preferably also included in addition to the phosphorescent material. Low-molecular weight compounds, polymers, and dendrimers can be used as this host material. Examples of the low-molecular weight compounds include CBP (4,4'-bis(carbazol-9-yl)-biphenyl), mCP (1,3-bis(9-carbazolyl)benzene), CDBP (4,4'-bis(carbazol-9-yl)-2,2'-dimethylbiphenyl), and derivatives of these compounds, whereas examples of the polymers include the organic electronic material of the embodiment described above, polyvinylcarbazole, polyphenylene, polyfluorene, and derivatives of these polymers.

Examples of the thermally activated delayed fluorescent materials include the compounds disclosed in Adv. Mater., 21, 4802-4906 (2009); Appl. Phys. Lett., 98, 083302 (2011); Chem. Comm., 48, 9580 (2012); Appl. Phys. Lett., 101, 093306 (2012); J. Am. Chem. Soc., 134, 14706 (2012); Chem. Comm., 48, 11392 (2012); Nature, 492, 234 (2012); Adv. Mater., 25, 3319 (2013); J. Phys. Chem. A, 117, 5607 (2013); Phys. Chem. Chem. Phys., 15, 15850 (2013); Chem. Comm., 49, 10385 (2013); and Chem. Lett., 43, 319 (2014) and the like.

[Hole Transport Layer, Hole Injection Layer]

In FIG. 1, the hole injection layer 3 and the hole transport layer 6 are organic layers formed using the organic electronic material described above, but the organic EL element of the present embodiment is not limited to this type of structure, and other organic layers may be formed using the organic electronic material described above. The organic layer formed using the organic electronic material described above is preferably used as at least one of a hole transport layer and a hole injection layer, and is more preferably used as at least a hole transport layer. For example, in those cases where the organic EL element has an organic layer formed using the organic electronic material described above as a hole transport layer, and also has a hole injection layer, a conventional material may be used for the hole injection layer. Further, in those cases where the organic EL element has an organic layer formed using the organic electronic material described above as a hole injection layer, and also has a hole transport layer, a conventional material may be used for the hole transport layer:

Examples of materials that can be used for the hole injection layer and the hole transport layer include aromatic amine-based compounds (for example, aromatic diamines such as N,N'-di(naphthalen-1-yl)-N,N'-diphenyl-benzidine (α-NPD)), phthalocyanine-based compounds, and thiophene-based compounds (for example, thiophene-based conductive polymers (such as poly(3,4-ethylenedioxythiophene):poly(4-styrenesulfonate) (PEDOT:PSS) and the like).

[Electron Transport Layer, Electron Injection Layer]

Examples of materials that can be used for the electron transport layer and the electron injection layer include phenanthroline derivatives, bipyridine derivatives, nitro-substituted fluorene derivatives, diphenylquinone derivatives, thiopyran dioxide derivatives, condensed-ring tetracarboxylic acid anhydrides of naphthalene and perylene and the like, carbodiimides, fluorenylidenemethane derivatives, anthraquinodimethane and anthrone derivatives, oxadiazole derivatives, thiadiazole derivatives, benzimidazole derivatives (for example, 2,2',2"-(1,3,5-benzenetriyl)tris(1-phenyl-1H-benzimidazole) (TPBi)), quinoxaline derivatives, and aluminum complexes (for example, aluminum bis(2-methyl-8-quinolinolate)-4-(phenylphenolate) (BAlq)). Further, the organic electronic material of the embodiment described above may also be used.

[Cathode]

Examples of the cathode material include metals or metal alloys, such as Li, Ca, Mg, Al, In, Cs, Ba, Mg/Ag, LiF and CsF.

[Anode]

Metals (for example, Au) or other materials having conductivity can be used as the anode. Examples of the other materials include oxides (for example, ITO: indium oxide/tin oxide), and conductive polymers (for example, polythiophene-polystyrene sulfonate mixtures (PEDOT:PSS)).

[Substrate]

Glass and plastics and the like can be used as the substrate. The substrate is preferably transparent. Further, a substrate having flexibility (a flexible substrate) is preferred. Quartz glass and light-transmitting resin films and the like can be used particularly favorably as the substrate.

Examples of the resin films include films composed of polyethylene terephthalate, polyethylene naphthalate, polyethersulfone, polyetherimide, polyetheretherketone, polyphenylene sulfide, polyarylate, polyimide, polycarbonate, cellulose triacetate or cellulose acetate propionate.

In those cases where a resin film is used, an inorganic substance such as silicon oxide or silicon nitride may be coated onto the resin film to inhibit the transmission of water vapor and oxygen and the like.

[Emission Color]

There are no particular limitations on the color of the light emission from the organic EL element. White organic EL elements can be used for various illumination fixtures, including domestic lighting, in-vehicle lighting, watches and liquid crystal backlights, and are consequently preferred.

The method used for forming a white organic EL element may employ a method in which a plurality of light-emitting materials are used to emit a plurality of colors simultaneously, which are then mixed to obtain a white light emission. There are no particular limitations on the combination of the plurality of emission colors, and examples include combinations that include three maximum emission wavelengths for blue, green and red, and combinations that include two maximum emission wavelengths for blue and yellow, or for yellowish green and orange or the like. Control of the emission color can be achieved by appropriate adjustment of the types and amounts of the light-emitting materials.

<Display Element, Illumination Device, Display Device>

A display element that represents one embodiment of the present invention contains the organic EL element of the embodiment described above. For example, by using the organic EL element as the element corresponding with each pixel of red, green and blue (RGB), a color display element can be obtained. Examples of the image formation method include a simple matrix in which organic EL elements arrayed in a panel are driven directly by an electrode arranged in a matrix, and an active matrix in which a thin-film transistor is positioned on, and drives, each element.

Further, an illumination device that represents an embodiment of the present invention contains the organic EL element of the embodiment described above. Moreover, a display device that represents another embodiment of the present invention contains the illumination device and a liquid crystal element as a display unit. For example, the display device may be a device that uses the illumination device of an embodiment of the present invention as a backlight, and uses a conventional liquid crystal element as the display unit, namely a liquid crystal display device.

EXAMPLES

The present invention is described below in further detail using a series of examples, but the present invention is not limited by the following examples.

<1-1> Preparation of Charge Transport Polymers (Preparation of Pd Catalyst)

In a glove box under a nitrogen atmosphere and at room temperature, tris(dibenzylideneacetone)dipalladium (73.2 mg, 80 μmol) was weighed into a sample tube, anisole (15 mL) was added, and the resulting mixture was agitated for 30 minutes. In a similar manner, tris(t-butyl)phosphine (129.6 mg, 640 μmop was weighed into a sample tube, anisole (5 mL) was added, and the resulting mixture was agitated for 5 minutes. These two solutions were then mixed together and stirred for 30 minutes at room temperature to obtain a catalyst. All the solvents used were deaerated by nitrogen bubbling for at least 30 minutes prior to use.

(Charge Transport Polymer 1)

A three-neck round-bottom flask was charged with a monomer L1 shown below (5.0 mmol), a monomer B1 shown below (2.0 mmol), a monomer T1a shown below (4.0 mmol) and anisole (20 mL), and the prepared Pd catalyst solution (7.5 mL) was then added. After stirring for 30 minutes, a 10% aqueous solution of tetraethylammonium hydroxide (20 mL) was added. All of the solvents were deaerated by nitrogen bubbling for at least 30 minutes prior to use. The resulting mixture was heated and refluxed for two hours. All the operations up to this point were conducted under a stream of nitrogen.

[Chemical formula 11]

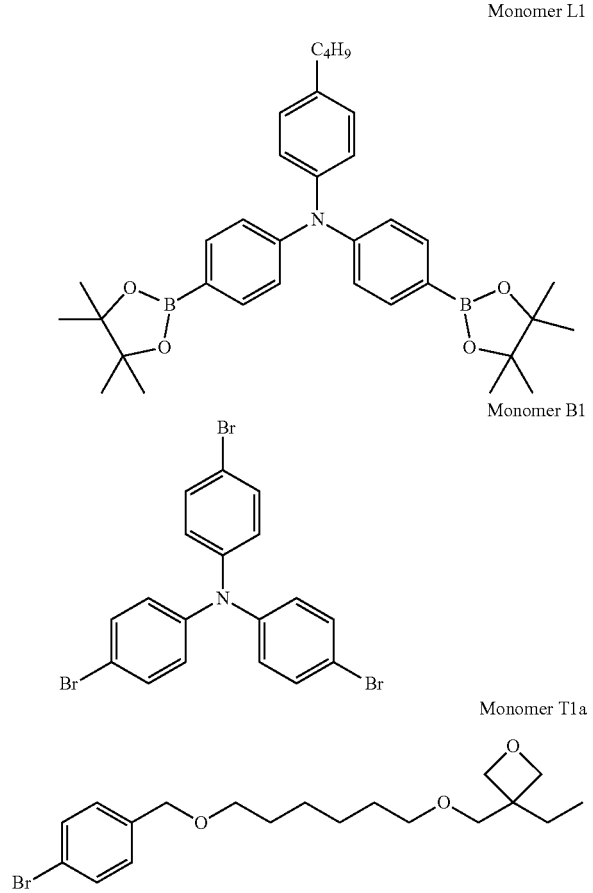

After completion of the reaction, the organic layer was washed with water and then poured into methanol-water (9:1). The resulting precipitate was collected by filtration under reduced pressure, and washed with methanol-water (9:1). The thus obtained precipitate was dissolved in toluene,

[Chemical formula 12]

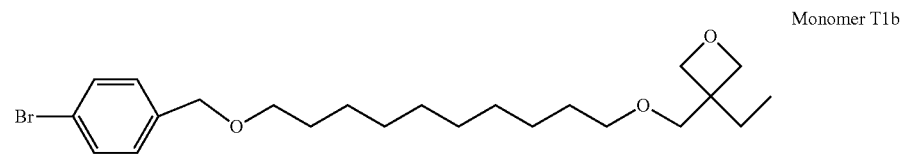

and re-precipitated from methanol. The obtained precipitate was collected by filtration under reduced pressure and then dissolved in toluene, and a metal adsorbent ("Triphenylphosphine, polymer-bound on styrene-divinylbenzene copolymer", manufactured by Strem Chemicals Inc., 200 mg per 100 mg of the precipitate) was then added to the solution and stirred overnight.

Following completion of the stirring, the metal adsorbent and other insoluble matter were removed by filtration, and the filtrate was concentrated using a rotary evaporator. The concentrate was dissolved in toluene, and then re-precipitated from methanol-acetone (8:3). The thus produced precipitate was collected by filtration under reduced pressure and washed with methanol-acetone (8:3). The thus obtained precipitate was then dried under vacuum to obtain a charge transport polymer 1.

The thus obtained charge transport polymer 1 had a number average molecular of 13,600 and a weight average molecular weight of 72,800. The charge transport polymer 1 had a structural unit L (derived from the monomer L1), a structural unit B (derived from the monomer B1) and a structural unit T1 (derived from the monomer T1a), and the proportions of those structural units were, in order, 45.5%, 18.2% and 36.3% respectively.

The number average molecular weight and the weight average molecular weight was measured by GPC (relative to polystyrene standards) using tetrahydrofuran (THF) as the eluent. The measurement conditions were as follows.

Feed pump: L-6050, manufactured by Hitachi High-Technologies Corporation

UV-Vis detector: L-3000, manufactured by Hitachi High-Technologies Corporation

Columns: Gelpack (a registered trademark) GL-A160S/GL-A150S, manufactured by Hitachi Chemical Co., Ltd.

Eluent: THF (for HPLC, stabilizer-free), manufactured by Wako Pure Chemical Industries, Ltd.

Flow rate: 1 mL/min

Column temperature: room temperature

Molecular weight standards: standard polystyrenes (Charge Transport Polymer 2)

A three-neck round-bottom flask was charged with the monomer L1 shown above (5.0 mmol), the monomer B1 shown above (2.0 mmol), a monomer T1b shown below (4.0 mmol) and anisole (20 mL), and the prepared Pd catalyst solution (7.5 mL) was then added. Thereafter, the same method as that described for the charge transport polymer 1 was used to prepare a charge transport polymer 2.

The obtained charge transport polymer 2 had a number average molecular of 24,700 and a weight average molecular weight of 49,100. The charge transport polymer 2 had a structural unit L (derived from the monomer L1), a structural unit B (derived from the monomer B1) and a structural unit T1 (derived from the monomer T1b), and the proportions of those structural units were, in order, 45.5%, 18.2% and 36.3% respectively.

(Charge Transport Polymer 3)

A three-neck round-bottom flask was charged with the monomer L1 shown above (5.0 mmol), the monomer B1 shown above (2.0 mmol), a monomer T1c shown below (4.0 mmol) and anisole (20 mL), and the prepared Pd catalyst solution (7.5 mL) was then added. Thereafter, the same method as that described for the charge transport polymer 1 was used to prepare a charge transport polymer 3.

The obtained charge transport polymer 3 had a number average molecular of 15,100 and a weight average molecular weight of 58,200. The charge transport polymer 3 had a structural unit L (derived from the monomer L1), a structural unit B (derived from the monomer B1) and a structural unit T1 (derived from the monomer T1c), and the proportions of those structural units were, in order, 45.5%, 18.2% and 36.3% respectively.

[Chemical formula 13]

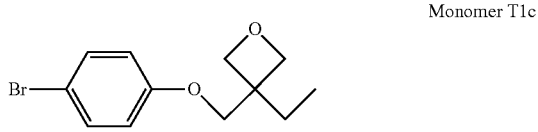

Monomer T1c (Charge Transport Polymer 4)

A three-neck round-bottom flask was charged with the monomer L1 shown above (5.0 mmol), the monomer B1 shown above (2.0 mmol), the monomer T1c shown above (1.0 mmol), a monomer T2a shown below (3.0 mmol) and anisole (20 mL), and the prepared Pd catalyst solution (7.5 mL) was then added. Thereafter, the same method as that described for the charge transport polymer 1 was used to prepare a charge transport polymer 4.

The obtained charge transport polymer 4 had a number average molecular of 15,700 and a weight average molecular weight of 56,400. The charge transport polymer 4 had a structural unit L (derived from the monomer L1), a structural unit B (derived from the monomer B1), a structural unit T1 (derived from the monomer T1c) and a structural unit T2 (derived from the monomer T2a), and the proportions of those structural units were, in order, 45.5%, 18.2%, 9.1% and 27.2% respectively.

[Chemical formula 14]

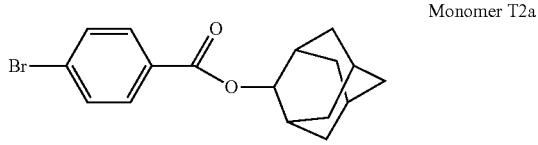

Monomer T2a (Charge Transport Polymer 5)

A three-neck round-bottom flask was charged with the monomer L1 shown above (5.0 mmol), the monomer B1 shown above (2.0 mmol), the monomer T1c shown above (1.2 mmol), the monomer T2a shown above (2.8 mmol) and anisole (20 mL), and the prepared Pd catalyst solution (7.5 mL) was then added. Thereafter, the same method as that described for the charge transport polymer 1 was used to prepare a charge transport polymer 5.

The obtained charge transport polymer 5 had a number average molecular of 12,800 and a weight average molecular weight of 41,800. The charge transport polymer 5 had a structural unit L (derived from the monomer L1), a structural unit B (derived from the monomer B1), a structural unit T1 (derived from the monomer T1c) and a structural unit T2 (derived from the monomer T2a), and the proportions of those structural units were, in order, 45.5%, 18.2%, 10.9% and 25.4% respectively.

(Charge Transport Polymer 6)

A three-neck round-bottom flask was charged with the monomer L1 shown above (5.0 mmol), the monomer B1 shown above (2.0 mmol), the monomer T1c shown above (1.6 mmol), the monomer T2a shown above (2.4 mmol) and anisole (20 mL), and the prepared Pd catalyst solution (7.5 mL) was then added. Thereafter, the same method as that described for the charge transport polymer 1 was used to prepare a charge transport polymer 6.

The obtained charge transport polymer 6 had a number average molecular of 12,600 and a weight average molecular weight of 41,000. The charge transport polymer 6 had a structural unit L (derived from the monomer L1), a structural unit B (derived from the monomer B1), a structural unit T1 (derived from the monomer T1c) and a structural unit T2 (derived from the monomer T2a), and the proportions of those structural units were, in order, 45.5%, 18.2%, 14.5% and 21.8% respectively.

(Charge Transport Polymer 7)

A three-neck round-bottom flask was charged with the monomer L1 shown above (5.0 mmol), the monomer B1 shown above (2.0 mmol), the monomer T1c shown above (2.0 mmol), the monomer T2a shown above (2.0 mmol) and anisole (20 mL), and the prepared Pd catalyst solution (7.5 mL) was then added. Thereafter, the same method as that described for the charge transport polymer 1 was used to prepare a charge transport polymer 7.

The obtained charge transport polymer 7 had a number average molecular of 13,500 and a weight average molecular weight of 42,100. The charge transport polymer 7 had a structural unit L (derived from the monomer L1), a structural unit B (derived from the monomer B1), a structural unit T1 (derived from the monomer T1c) and a structural unit T2 (derived from the monomer T2a), and the proportions of those structural units were, in order, 45.5%, 18.2%, 18.15% and 18.15% respectively.

(Charge Transport Polymer 8)

A three-neck round-bottom flask was charged with the monomer L1 shown above (5.0 mmol), the monomer B1 shown above (2.0 mmol), the monomer T1c shown above (2.0 mmol), a monomer T2b shown below (2.0 mmol) and anisole (20 mL), and the prepared Pd catalyst solution (7.5 mL) was then added. Thereafter, the same method as that described for the charge transport polymer 1 was used to prepare a charge transport polymer 8.

The obtained charge transport polymer 8 had a number average molecular of 13,000 and a weight average molecular weight of 45,100. The charge transport polymer 8 had a structural unit L (derived from the monomer L1), a structural unit B (derived from the monomer B1), a structural unit T1 (derived from the monomer T1c) and a structural unit T2 (derived from the monomer T2b), and the proportions of those structural units were, in order, 45.5%, 18.2%, 18.15% and 18.15% respectively.

[Chemical formula 15]

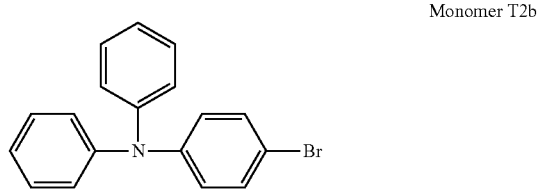

Monomer T2b (Charge Transport Polymer 9)

A three-neck round-bottom flask was charged with the monomer L1 shown above (5.0 mmol), the monomer B1 shown above (2.0 mmol), the monomer T1c shown above (1.0 mmol), the monomer T2b shown above (3.0 mmol) and anisole (20 mL), and the prepared Pd catalyst solution (7.5 mL) was then added. Thereafter, the same method as that described for the charge transport polymer 1 was used to prepare a charge transport polymer 9.

The obtained charge transport polymer 9 had a number average molecular of 12,300 and a weight average molecular weight of 55,800. The charge transport polymer 9 had a structural unit L (derived from the monomer L1), a structural unit B (derived from the monomer B1), a structural unit T1 (derived from the monomer T1c) and a structural unit T2 (derived from the monomer T2b), and the proportions of those structural units were, in order, 45.5%, 18.2%, 9.1% and 27.2% respectively.

(Charge Transport Polymer 10)

A three-neck round-bottom flask was charged with the monomer L1 shown above (5.0 mmol), the monomer B1 shown above (2.0 mmol), the monomer T1c shown above (2.0 mmol), a monomer T2c shown below (2.0 mmol) and anisole (20 mL), and the prepared Pd catalyst solution (7.5 mL) was then added. Thereafter, the same method as that described for the charge transport polymer 1 was used to prepare a charge transport polymer 10.

The obtained charge transport polymer 10 had a number average molecular of 15,700 and a weight average molecular weight of 45,100. The charge transport polymer 10 had a structural unit L (derived from the monomer L1), a structural unit B (derived from the monomer B1), a structural unit T1 (derived from the monomer T1c) and a structural unit T2 (derived from the monomer T2c), and the proportions of those structural units were, in order, 45.5%, 18.2%, 18.15% and 18.15% respectively.

[Chemical formula 16]

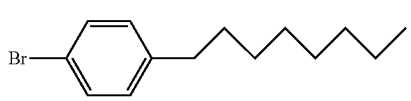

Monomer T2c (Charge Transport Polymer 11)

A three-neck round-bottom flask was charged with the monomer L1 shown above (5.0 mmol), the monomer B1 shown above (2.0 mmol), the monomer T1c shown above (1.0 mmol), the monomer T2c shown above (3.0 mmol) and anisole (20 mL), and the prepared Pd catalyst solution (7.5 mL) was then added. Thereafter, the same method as that described for the charge transport polymer 1 was used to prepare a charge transport polymer 11.

The obtained charge transport polymer 11 had a number average molecular of 16,400 and a weight average molecular weight of 46,900. The charge transport polymer 11 had a structural unit L (derived from the monomer L1), a structural unit B (derived from the monomer B1), a structural unit T1 (derived from the monomer T1c) and a structural unit T2 (derived from the monomer T2c), and the proportions of those structural units were, in order, 45.5%, 18.2%, 9.1% and 27.2% respectively.

(Charge Transport Polymer 12)

A three-neck round-bottom flask was charged with a monomer L2 shown below (5.0 mmol), the monomer B1 shown above (2.0 mmol), the monomer T1c shown above (1.0 mmol), the monomer T2a shown above (3.0 mmol) and anisole (20 mL), and the prepared Pd catalyst solution (7.5 mL) was then added. Thereafter, the same method as that described for the charge transport polymer 1 was used to prepare a charge transport polymer 12.

The obtained charge transport polymer 12 had a number average molecular of 18,900 and a weight average molecular weight of 49,100. The charge transport polymer 12 had a structural unit L (derived from the monomer L2), a structural unit B (derived from the monomer B1), a structural unit T1 (derived from the monomer T1c) and a structural unit T2 (derived from the monomer T2a), and the proportions of those structural units were, in order, 45.5%, 18.2%, 9.1% and 27.2% respectively.

[Chemical formula 17]

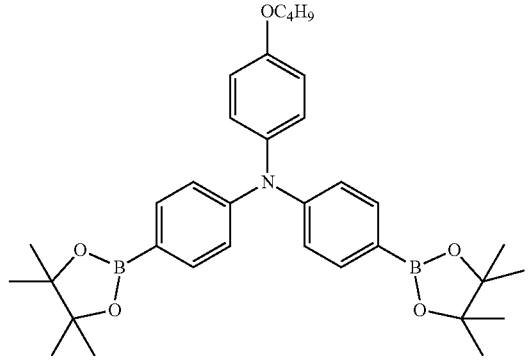

Monomer L2

The monomers used in the preparation of the charge transport polymers 1 to 12 are summarized below in Table 1. In the table, monomers labeled with (*) have a structure represented by formula (T).

TABLE 1

| Charge transport polymer | Monomers used | | |
|---|---|---|---|
| | Structural unit L | Structural unit B | Structural unit T |
| Polymer 1 | L1 | B1 | T1a |
| Polymer 2 | L1 | B1 | T1b |
| Polymer 3 | L1 | B1 | T1c (*) |
| Polymer 4 | L1 | B1 | T1c (*) + T2a |
| Polymer 5 | L1 | B1 | T1c (*) + T2a |
| Polymer 6 | L1 | B1 | T1c (*) + T2a |
| Polymer 7 | L1 | B1 | T1c (*) + T2a |
| Polymer 8 | L1 | B1 | T1c (*) + T2b |
| Polymer 9 | L1 | B1 | T1c (*) + T2b |
| Polymer 10 | L1 | B1 | T1c (*) + T2c |
| Polymer 11 | L1 | B1 | T1c (*) + T2c |
| Polymer 12 | L2 | B1 | T1c (*) + T2a |

<1-2> Evaluation of Charge Transport Polymers

The thermal weight reduction upon heating to 300° C. for each of the charge transport polymers 1 to 12 is shown in Table 2. Here, the thermal weight reduction (% by mass) refers to a measured value obtained using a thermogravimetric-differential thermal analysis (TG-DTA) apparatus (DTG-60/60H, manufactured by Shimadzu Corporation) when a 10 mg sample of the charge transport polymer is heated in the air to 300° C. under temperature increase conditions of 5° C./minute. A smaller measured value means superior heat resistance.

TABLE 2

| Charge transport polymer | Thermal weight reduction upon heating to 300° C. (% by mass) |
|---|---|
| 1 | 6.8 |
| 2 | 12.0 |
| 3 | 3.1 |
| 4 | 0.8 |
| 5 | 1.0 |
| 6 | 1.0 |
| 7 | 1.0 |
| 8 | 1.4 |
| 9 | 0.8 |
| 10 | 2.4 |
| 11 | 2.3 |
| 12 | 0.4 |

Based on the results shown in the table, it is evident that the charge transport polymers 3 to 12 having the specific structural region represented by formula (I) exhibit clearly lower thermal weight reduction upon heating to 300° C. and have superior heat resistance compared with the charge transport polymers 1 and 2 which do not have the specific structural region. Accordingly, by using a charge transport polymer having the specific structural region represented by formula (I), an organic electronic material having excellent heat resistance can be provided. Among the above charge transport polymers 3 to 12, based on the fact that the polymers 4 to 9 and the polymer 12 exhibit superior heat resistance to the polymer 3, it is evident that increasing the proportion of cyclic structures contained within the molecule enables further improvement in the heat resistance.

<2-1> Production of Organic Hole-Only Devices (HOD)

Example 1

An ink composition was prepared in the open atmosphere by mixing the charge transport polymer 3 prepared above (10.0 mg), a polymerization initiator 1 shown below (0.5 mg) and toluene (2.3 mL). This ink composition was spin-coated at a rotational rate of 3,000 min$^{-1}$ onto a glass substrate on which ITO had been patterned with a width of 1.6 mm, and the ink composition was then cured by heating at 200° C. for 30 minutes on a hot plate, thus forming a hole injection layer (100 nm).

[Chemical formula 18]

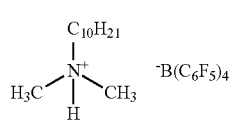

Polymerization initiator 1

The glass substrate obtained above was transferred to a vacuum deposition apparatus, α-NPD (20 nm) and Al (100 nm) were deposited sequentially on top of the hole injection layer using deposition methods, and an encapsulation treatment was then performed to complete production of an organic HOD 1.

Using the same procedure as that used in the production of the organic HOD 1, the ink composition was spin-coated at a rotational rate of 3,000 min$^{-1}$ onto a glass substrate on which ITO had been patterned with a width of 1.6 mm, and the ink composition was heated at 200° C. for 30 minutes on a hot plate. With the exception of then performing additional heating at 230° C. for 30 minutes under a nitrogen atmosphere to form the hole injection layer, an organic HOD 2 was subsequently produced in the same manner as the production of the organic HOD 1.

Example 2

With the exception of replacing the charge transport polymer 3 with the charge transport polymer 4 in the formation steps for the hole injection layers in the organic HODs 1 and 2 of Example 1, organic HODs were produced in the same manner as Example 1.

Example 3

With the exception of replacing the charge transport polymer 3 with the charge transport polymer 5 in the formation steps for the hole injection layers in the organic HODs 1 and 2 of Example 1, organic HODs were produced in the same manner as Example 1.

Example 4

With the exception of replacing the charge transport polymer 3 with the charge transport polymer 6 in the formation steps for the hole injection layers in the organic HODs 1 and 2 of Example 1, organic HODs were produced in the same manner as Example 1.

Example 5

With the exception of replacing the charge transport polymer 3 with the charge transport polymer 7 in the formation steps for the hole injection layers in the organic HODs 1 and 2 of Example 1, organic HODs were produced in the same manner as Example 1.

Example 6

With the exception of replacing the charge transport polymer 3 with the charge transport polymer 8 in the formation steps for the hole injection layers in the organic HODs 1 and 2 of Example 1, organic HODs were produced in the same manner as Example 1.

Example 7

With the exception of replacing the charge transport polymer 3 with the charge transport polymer 9 in the formation steps for the hole injection layers in the organic HODs 1 and 2 of Example 1, organic HODs were produced in the same manner as Example 1.

Example 8

With the exception of replacing the charge transport polymer 3 with the charge transport polymer 10 in the formation steps for the hole injection layers in the organic HODs 1 and 2 of Example 1, organic HODs were produced in the same manner as Example 1.

Example 9

With the exception of replacing the charge transport polymer 3 with the charge transport polymer 11 in the formation steps for the hole injection layers in the organic HODs 1 and 2 of Example 1, organic HODs were produced in the same manner as Example 1.

Example 10

With the exception of replacing the charge transport polymer 3 with the charge transport polymer 12 in the formation steps for the hole injection layers in the organic HODs 1 and 2 of Example 1, organic HODs were produced in the same manner as Example 1.

Comparative Example 1

With the exception of replacing the charge transport polymer 3 with the charge transport polymer 1 in the formation steps for the hole injection layers in the organic HODs 1 and 2 of Example 1, organic HODs were produced in the same manner as Example 1.

Comparative Example 2

With the exception of replacing the charge transport polymer 3 with the charge transport polymer 2 in the formation steps for the hole injection layers in the organic HODs 1 and 2 of Example 1, organic HODs were produced in the same manner as Example 1.

<2-2> Evaluation of Organic HODs (Hole Injection Layers)

A voltage was applied to each of the organic HODs produced in Examples 1 to 10 and Comparative Examples 1 and 2. The results indicated current flow in each case, confirming that each of the elements had hole injection functionality. Further, the drive voltage was also measured for each organic HOD. The measurement results are shown in Table 3.

<2-3> Evaluation of Curability of Ink Compositions

The curability of the ink composition used for forming the hole injection layer was evaluated by measuring the residual film ratio for an organic thin film using the method described below. The measurement results are shown in Table 3.
(Method for Measuring Residual Film Ratio)

Each of the hole transport polymers (10.0 mg) used in Examples 1 to 10 and Comparative Examples 1 and 2 was dissolved in toluene (1,991 μL) to obtain a polymer solution. Further, the polymerization initiator 1 shown above (0.309 mg) was dissolved in toluene (309 μL) to obtain a polymerization initiator solution. The thus obtained polymer solution and polymerization initiator solution were then mixed together to prepare an ink composition.

The ink composition was spin-coated at room temperature (25° C.) at a rotational rate of 3,000 min$^{-1}$ onto a quartz glass plate, thus forming an organic thin film. The quartz glass plate having the organic thin film was then heated at 200° C. for 30 minutes on a hot plate, thereby curing the organic thin film. Subsequently, the quartz glass plate was grasped with a pair of tweezers and immersed in a 200 mL beaker filled with toluene (25° C.), and the quartz glass plate was agitated 10 times back and forth in the thickness direction of the quartz glass plate over a period of 10 seconds.

The absorbance (Abs) at the absorption maximum (λmax) in the UV-vis spectrum of the organic thin film was measured before and after the immersion, and the residual film ratio of the organic thin film was determined from the ratio between the two absorbance values using the formula below. A higher residual film ratio means superior curability of the ink composition.

Residual film ratio (%)=Abs of organic thin film after immersion/Abs of organic thin film before immersion×100

Measurement of the absorbance was performed using a spectrophotometer (U-3310, manufactured by Hitachi, Ltd.), by measuring the absorbance of the organic thin film at the maximum absorption wavelength within a wavelength range from 300 to 500 nm.

TABLE 3

| | Polymer used | Drive voltage 1 (V) | Drive voltage 2 (V) | Increase in drive voltage | Residual film ratio (%) |
|---|---|---|---|---|---|
| Example 1 | 3 | 3.8 | 4.2 | 0.4 | 99.8 |
| Example 2 | 4 | 3.5 | 3.5 | 0 | 100 |
| Example 3 | 5 | 2.8 | 2.8 | 0 | 99.8 |
| Example 4 | 6 | 3.0 | 2.9 | 0.1 | 98.7 |
| Example 5 | 7 | 3.0 | 3.0 | 0 | 97.3 |
| Example 6 | 8 | 2.8 | 3.2 | 0.4 | 99.9 |
| Example 7 | 9 | 3.0 | 3.1 | 0.1 | 99.9 |
| Example 8 | 10 | 2.6 | 3.2 | 0.5 | 99.9 |
| Example 9 | 11 | 2.8 | 2.9 | 0.1 | 99.0 |
| Example 10 | 12 | 2.8 | 3.8 | 1.0 | 99.1 |
| Comparative Example 1 | 1 | 3.5 | 7.0 | 3.5 | 98.9 |
| Comparative Example 2 | 2 | 3.5 | >10.0 | >6.5 | 99.8 |

Drive voltage 1: the drive voltage for the organic HOD 1 (heating at 200° C. for 30 minutes) measured at a current density of 300 mA/cm.

Drive voltage 2: the drive voltage for the organic HOD 2 (heating at 200° C. for 30 minutes, followed by heating at 230° C. for 30 minutes) measured at a current density of 300 mA/cm.

Increase in drive voltage: the value of drive voltage 2 (V)–drive voltage 1 (V)

As shown in the table, the organic HODs of Examples 1 to 10 exhibited smaller values for the increase in drive voltage than Comparative Examples 1 and 2. In other words, from the viewpoint of the constituent material of the hole injection layer, it is evident that by using an organic electronic material containing a charge transport polymer having a small thermal weight reduction value (having excellent heat resistance), any increase in the drive voltage following high-temperature heating can be suppressed. Accordingly, it is evident that by using the organic electronic material that represents one embodiment of the present invention, thermal degradation of the organic layer is suppressed. Furthermore, it is also evident that the organic electronic materials (Examples 1 to 10) that represent embodiments of the present invention all exhibited excellent curability, and were therefore suitable for wet processes.

<3-1> Production of Organic EL Elements

Organic EL elements were produced which contained hole injection layers formed using the charge transport polymers prepared above, and the performance of these elements was evaluated.

Example 11

An ink composition was prepared in the open atmosphere by mixing the charge transport polymer 3 (10.0 mg), the polymerization initiator 1 shown above (0.5 mg) and toluene (2.3 mL). This ink composition was spin-coated at a rotational rate of 3,000 min$^{-1}$ onto a glass substrate on which ITO had been patterned with a width of 1.6 mm, and the ink composition was then cured by heating at 200° C. for 10 minutes on a hot plate. Additional heating was then performed at 230° C. for 30 minutes under a nitrogen atmosphere, thus forming a hole injection layer (30 nm).

The glass substrate having the above hole injection layer was transferred into a vacuum deposition apparatus, and layers of α-NPD (40 nm), CBP:Ir(ppy)$_3$ (94:6, 30 nm), BAlq (10 nm), TPBi (30 nm), LiF (0.8 nm) and Al (100 nm) were deposited in that order using deposition methods on top of the hole injection layer. An encapsulation treatment was then performed to complete production of an organic EL element.

Example 12

With the exception of replacing the charge transport polymer 3 with the charge transport polymer 4 in the formation step for the hole injection layer in the organic EL element of Example 11, an organic EL element was produced in the same manner as Example 11.

Example 13

With the exception of replacing the charge transport polymer 3 with the charge transport polymer 12 in the formation step for the hole injection layer in the organic EL element of Example 11, an organic EL element was produced in the same manner as Example 11.

<3-2> Evaluation of Organic. EL Elements

When a voltage was applied to each of the organic EL elements obtained in Examples 11 to 13, green light emission was confirmed in each case. For each element, the drive voltage and emission efficiency at an emission luminance of 5,000 cd/m$^2$, and the emission lifespan (luminance half-life) when the initial luminance was 5,000 cd/m$^2$ were measured. The measurement results are shown in Table 4.

TABLE 4

| | Polymer used | Drive voltage (V) | Emission efficiency (cd/A) | Emission lifespan (h) |
| --- | --- | --- | --- | --- |
| Example 11 | 3 | 8.2 | 30.0 | 303 |
| Example 12 | 4 | 7.6 | 32.9 | 318 |
| Example 13 | 12 | 7.8 | 29.7 | 303 |

The organic EL elements of Examples 11 to 13 each have a hole injection layer obtained by conducting a high-temperature baking treatment. In each case, excellent results were obtained for the drive voltage, the emission efficiency and the emission lifespan. In other words, it is evident that by using a charge transport polymer having excellent heat resistance as the hole injection layer material, thermal degradation can be suppressed and the hole injection characteristics can be maintained.

Effects of the embodiments of the present invention have been illustrated above using a series of examples. However, the present invention is not limited to the charge transport polymers used in the examples, and similar effects can be obtained using different charge transport compounds, provided they do not exceed the scope of the present invention. Further, use of the organic electronic material of the present invention is not limited to the organic EL elements described in the examples, and it should be evident that thermal degradation of organic layers can also be suppressed in other organic electronic elements.

DESCRIPTION OF THE REFERENCE SIGNS

1: Light-emitting layer
2: Anode
3: Hole injection layer
4: Cathode
5: Electron injection layer
6: Hole transport layer
7: Electron transport layer
8: Substrate

The invention claimed is:

1. An organic electronic material comprising a charge transport compound having a weight average molecular weight greater than 40,000 measured by gel permeation chromatography (GPC) using a calibration curve of standard polystyrenes, and exhibiting a thermal weight reduction upon heating to 300° C. of not more than 5% determined by using a thermogravimetric-differential thermal analysis (TG-DTA) apparatus when a 10 mg of the charge transport compound is heated in the air to 300° C. under temperature increase conditions of 5° C./minute,
wherein the charge transport compound is a charge transport polymer having a divalent structural unit with charge transport properties, a trivalent or higher structural unit that constitutes a branched structure in three or more directions, and a monovalent structural unit that constitutes a terminal portion of the charge transport polymer, wherein the monovalent structural unit comprises a structural unit represented by formula (I-3) below:

$$—Ar—O—(CH_2)_n—Z \qquad (I\text{-}3)$$

wherein Ar represents an arylene group or heteroarylene group of 2 to 30 carbon atoms, Z represents a substituted or unsubstituted polymerizable functional group, and n is an integer from 1 to 10.

2. The organic electronic material according to claim 1, wherein the polymerizable functional group includes at least one type of group selected from the group consisting of an oxetane group, an epoxy group, a vinyl group, an acryloyl group and a methacryloyl group.

3. The organic electronic material according to claim 1, wherein the structural region represented by the formula (I-3) is positioned at a terminal of the charge transport compound.

4. The organic electronic material according to claim 1, wherein the charge transport compound is a hole injection layer material.

5. The organic electronic material according to claim 1, wherein the charge transport compound contains at least one type of structure selected from the group consisting of aromatic amine structures, carbazole structures, thiophene structures, bithiophene structures, benzene structures, phenoxazine structures and fluorene structures.

6. The organic electronic material according to claim 1, wherein the charge transport compound is a charge transport polymer.

7. The organic electronic material according to claim 1, further comprising a polymerization initiator.

8. The organic electronic material according to claim 7, wherein the polymerization initiator comprises a cationic polymerization initiator.

9. The organic electronic material according to claim 8, wherein the cationic polymerization initiator comprises an onium salt.

10. The organic electronic material according to claim 9, further comprising a solvent.

11. The organic electronic material according to claim 10, wherein the solvent is a non-polar solvent.

12. An organic layer formed from the organic electronic material according g to claim 1.

13. An organic electronic element comprising the organic layer according to claim 12.

14. An organic electroluminescent element comprising the organic layer according to claim 12.

15. The organic electroluminescent element according to claim 14, having a light-emitting layer containing a phosphorescent material.

16. The organic electroluminescent element according to claim 14, having a light-emitting layer containing a thermally activated delayed fluorescent material.

17. The organic electroluminescent element according to claim 14, also having a flexible substrate.

18. The organic electroluminescent element according to claim 14, also having a resin film substrate.

19. A display element comprising the organic electroluminescent according to claim 14.

20. An illumination device comprising the organic electroluminescent element according to claim 14.

21. A display device comprising the illumination device according to claim 20, and a liquid crystal element as a display unit.

22. The organic electronic material according to claim 1, wherein the charge transport compound further contains a structural unit represented by formula (II) below:

(II)

wherein:
(i) Ar represents an arylene group or heteroarylene group of 2 to 30 carbon atoms, J represents an ester linkage (—COO—), and R1 is a cyclic alkyl group of 3 to 30 carbon atoms, or
(ii) Ar represents an arylene group or heteroarylene group of 2 to 30 carbon atoms, J represents a linking group (—NR—) having a structure in which an additional one hydrogen atom has been removed from an amino group that R is a phenyl group, and R1 represents an arylene group of 6 to 30 carbon atoms.

* * * * *